United States Patent
Adamovich et al.

(10) Patent No.: US 10,109,815 B2
(45) Date of Patent: Oct. 23, 2018

(54) REDUCING OLED DEVICE EFFICIENCY AT LOW LUMINANCE

(71) Applicant: UNIVERSAL DISPLAY CORPORATION, Ewing, NJ (US)

(72) Inventors: Vadim Adamovich, Yardley, PA (US); Hitoshi Yamamoto, Pennington, NJ (US); Michael S. Weaver, Princeton, NJ (US); Julia J. Brown, Yardley, PA (US)

(73) Assignee: Universal Display Corporation, Ewing, NJ (US)

( * ) Notice: Subject to any disclaimer, the term of this patent is extended or adjusted under 35 U.S.C. 154(b) by 0 days.

(21) Appl. No.: 15/499,055

(22) Filed: Apr. 27, 2017

(65) Prior Publication Data
US 2017/0229671 A1    Aug. 10, 2017

Related U.S. Application Data

(62) Division of application No. 13/665,538, filed on Oct. 31, 2012, now Pat. No. 9,786,858.
(Continued)

(51) Int. Cl.
*H01L 51/50* (2006.01)
*H01L 51/52* (2006.01)
(Continued)

(52) U.S. Cl.
CPC ........ *H01L 51/5028* (2013.01); *C09K 11/025* (2013.01); *C09K 11/06* (2013.01);
(Continued)

(58) Field of Classification Search
None
See application file for complete search history.

(56) References Cited

U.S. PATENT DOCUMENTS 4,769,292 A   9/1988  Tang et al.
5,247,190 A   9/1993  Friend et al.
(Continued)

FOREIGN PATENT DOCUMENTS

WO   WO-2008057394 A1   5/2008
WO   WO-2010011390 A2   1/2010

OTHER PUBLICATIONS

Baldo, "Highly efficient phosphorescent emission from organic electroluminescent devices," Nature, vol. 395, pp. 151-154, 1998.
(Continued)

*Primary Examiner* — Gregory D Clark
(74) *Attorney, Agent, or Firm* — Morris & Kamlay LLP

(57) ABSTRACT

The invention provides a light emitting device, comprising: a first electrode; a second electrode; a light emitting layer disposed between the first electrode and the second electrode, wherein the light emitting layer comprises an emitting material having a first triplet energy level (T1); and an exciton quenching layer disposed between the light emitting layer and the second electrode, wherein the exciton quenching layer comprises a non-emitting quenching material having a second triplet energy level (T1); wherein the exciton quenching layer is disposed adjacent to the light emitting layer; wherein the emitting material emits by phosphorescence or delayed fluorescence; and wherein the first triplet energy level (T1) is higher than the second triplet energy level (T1). Methods of making the same are also provided.

17 Claims, 18 Drawing Sheets

Related U.S. Application Data

(60) Provisional application No. 61/554,123, filed on Nov. 1, 2011.

(51) Int. Cl.
*H01L 51/56* (2006.01)
*C09K 11/02* (2006.01)
*C09K 11/06* (2006.01)
*H01L 51/00* (2006.01)

(52) U.S. Cl.
CPC ........ *H01L 51/006* (2013.01); *H01L 51/0054* (2013.01); *H01L 51/0074* (2013.01); *H01L 51/0081* (2013.01); *H01L 51/0085* (2013.01); *H01L 51/5004* (2013.01); *H01L 51/5016* (2013.01); *H01L 51/5206* (2013.01); *H01L 51/5221* (2013.01); *H01L 51/56* (2013.01); *C09K 2211/1007* (2013.01); *C09K 2211/1029* (2013.01); *C09K 2211/185* (2013.01); *H01L 51/0058* (2013.01); *H01L 2251/5353* (2013.01); *H01L 2251/5384* (2013.01); *H01L 2251/552* (2013.01)

(56) References Cited

U.S. PATENT DOCUMENTS

| | | | |
|---|---|---|---|
| 5,703,436 | A | 12/1997 | Forrest et al. |
| 5,707,745 | A | 1/1998 | Forrest et al. |
| 5,834,893 | A | 11/1998 | Bulovic et al. |
| 5,844,363 | A | 12/1998 | Gu et al. |
| 6,013,982 | A | 1/2000 | Thompson et al. |
| 6,087,196 | A | 7/2000 | Sturm et al. |
| 6,091,195 | A | 7/2000 | Forrest et al. |
| 6,097,147 | A | 8/2000 | Baldo et al. |
| 6,294,398 | B1 | 9/2001 | Kim et al. |
| 6,303,238 | B1 | 10/2001 | Thompson et al. |
| 6,337,102 | B1 | 1/2002 | Forrest et al. |
| 6,468,819 | B1 | 10/2002 | Kim et al. |
| 7,279,704 | B2 | 10/2007 | Walters et al. |
| 7,431,968 | B1 | 10/2008 | Shtein et al. |
| 7,968,146 | B2 | 6/2011 | Wagner et al. |
| 2003/0104242 | A1 | 6/2003 | Aziz et al. |
| 2003/0230980 | A1 | 12/2003 | Forrest et al. |
| 2004/0174116 | A1 | 9/2004 | Lu et al. |
| 2005/0110007 | A1 | 5/2005 | Forrest et al. |
| 2005/0121666 | A1 * | 6/2005 | Kondakova ......... H01L 51/0085 257/40 |
| 2006/0216546 | A1 | 9/2006 | Tada |
| 2011/0227049 | A1 | 9/2011 | Xia et al. |

OTHER PUBLICATIONS

Baldo, "Very high-efficiency green organic light-emitting devices based on electrophosphorescence," Applied Physics Letters, vol. 75, No. 1, pp. 4-6, Jul. 5, 1999.

* cited by examiner

REDUCING OLED DEVICE EFFICIENCY AT LOW LUMINANCE

The present application is a divisional of U.S. application Ser. No. 13/665,538, filed Oct. 31, 2012, which claims the benefit of priority of U.S. Provisional Patent Application No. 61/554,123, filed Nov. 1, 2011, each of which is hereby incorporated by reference as though fully set forth herein.

The claimed invention was made by, on behalf of, and/or in connection with one or more of the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to OLED devices. In particular, the invention relates to OLED devices having highly accurate gray scales in display panels. The invention further relates to methods of making such devices.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted Ir(ppy)$_3$, which has the following structure:

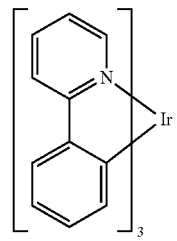

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processable" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY OF THE INVENTION

OLED devices having highly accurate gray scales in their display panels are provided. In at least one aspect, the invention provides a light emitting device, comprising: a first electrode; a second electrode; a light emitting layer disposed between the first electrode and the second electrode, wherein the light emitting layer comprises an emitting material having a first triplet energy level (T1); and an exciton quenching layer disposed between the light emitting layer and the second electrode, wherein the exciton quenching layer comprises a non-emitting quenching material having a second triplet energy level (T1); wherein the exciton quenching layer is disposed adjacent to the light emitting layer; wherein the emitting material emits by phosphorescence or delayed fluorescence; and wherein the first triplet energy level (T1) is higher than the second triplet energy level (T1). In some embodiments, the first electrode is an anode and the second electrode is a cathode. In other embodiments, the first electrode is a cathode and the second electrode is an anode.

The exciton quenching layer at least comprises a non-emitting quenching material. In some embodiments, the exciton quenching layer consists essentially of a non-emitting quenching material. In some embodiments, the exciton quenching layer comprises a host doped with a non-emitting quenching material. The exciton quenching layer can, in some embodiments, also include an emitting material. In other embodiments, however, the exciton quenching layer does not comprise an emitting material.

The light emitting layer at least comprises an emitting material. In some embodiments, the light emitting layer comprises a host doped with the emitting material. The host can be the same or different from the host that can be employed in the exciton quenching layer. In some embodiments where the light emitting layer and the exciton quenching layer both comprise a host, the hosts are the same. In some other embodiments, the hosts are different.

The device can also include other layers. For example, in some embodiments, the light emitting device comprises an electron transport layer disposed between the exciton quenching layer and the cathode. In embodiments where the exciton quenching layer lies on the opposite side of the light emitting layer from the cathode, the electron transport layer is disposed between the cathode and the light emitting layer. In embodiments where the exciton quenching layer lies on the same side of the light emitting layer as the cathode, the electron transport layer is disposed adjacent to the exciton quenching layer. In some further embodiments where the exciton quenching layer lies on the same side of the light emitting layer as the cathode, the light emitting device comprises a hole blocking layer that is disposed between the electron transport layer and the exciton quenching layer. In some such embodiments, the hole blocking layer is disposed directly adjacent to the exciton quenching layer. In some embodiments, the hole blocking layer comprises (or is doped with) a non-emitting quenching material. In some embodiments, the exciton quenching layer is a hole blocking layer doped with the non-emitting quenching material.

In certain embodiments of the invention, the emitting material in the light emitting layer has a higher triplet energy (T1) than that of the non-emitting quenching material. The device can employ any suitable difference in triplet energies between these two materials. In some embodiments, the difference is 0.1 to 1.5 eV, or 0.1 to 1.0 eV, or 0.1 to 0.6 eV.

Further, the exciton quenching layer can have any suitable thickness. For example, the exciton quenching layer can have a thickness ranging from 0.5 to 50 Å, or from 1 to 20 Å, or from 2 to 12 Å.

In embodiments of the invention, the luminous efficacy of the device is higher at higher luminance. For example, in some embodiments, the ratio of the luminous efficacy at 3000 nits to the luminous efficacy at 1 nit is at least 1.0, e.g., 1.0 to 10.0, or 1.5 to 5.5, or 2.0 to 5.0, or 2.5 to 4.0. In some such embodiments, the light emitting material in the device emits green light. In some other embodiments, the luminous efficacy at 800 nits to the luminous efficacy at 1 nit is at least 1.0, e.g., 1.0 to 10.0, or 1.5 to 5.5, or 2.0 to 5.0, or 2.5 to 4.0. In some such embodiments, the light emitting material emits red or blue light. In some embodiments where the device emits green light, the luminous efficacy of the device at 1 nit ranges from 1 to 50 cd/A, or from 3 to 40 cd/A, or from 5 to 25 cd/A, or from 5 to 15 cd/A. In some embodiments where the device emits red or blue light, the luminous efficacy at 1 nit ranges from 0.2 to 13 cd/A, or from 0.8 to 11 cd/A, or from 1.3 to 7 cd/A, or from 1.3 to 4 cd/A.

The invention can employ any suitable non-emitting quenching material. In some embodiments, the non-emitting quenching material is an electron transporter. In some embodiments, the non-emitting quenching material is a metal complex, for example, a metal complex with aluminum, beryllium, or zinc. In some other embodiments, the non-emitting quenching material is a polycyclic aromatic compound. In some embodiments, the non-emitting quenching material is selected from the group consisting of:

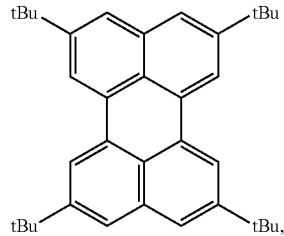
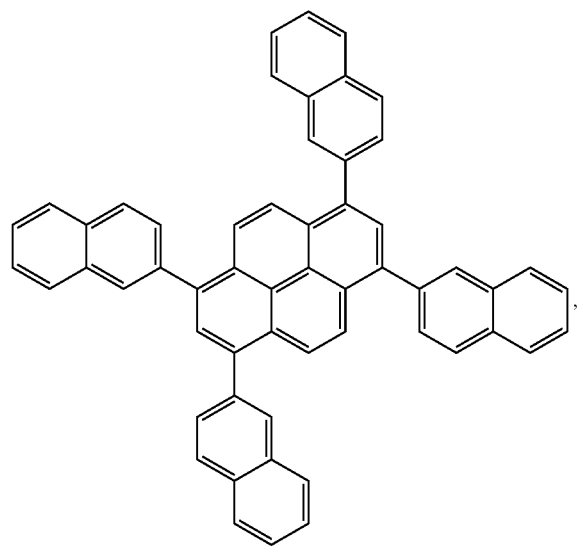
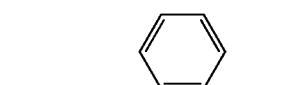
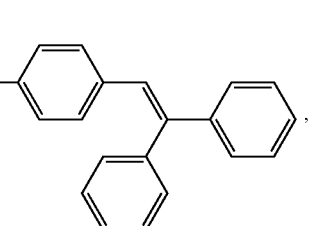
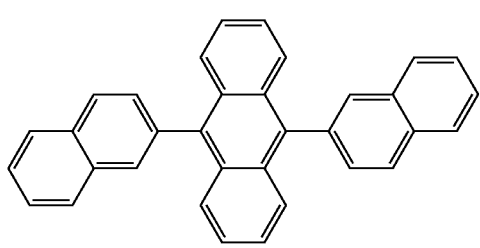
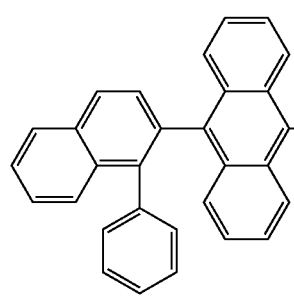
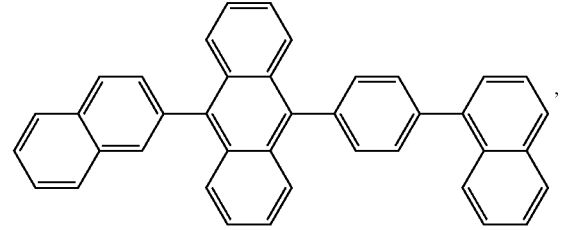
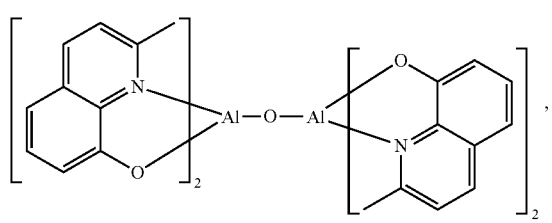
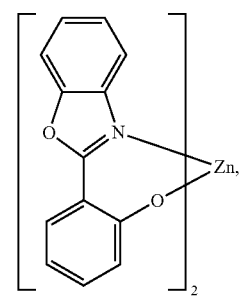
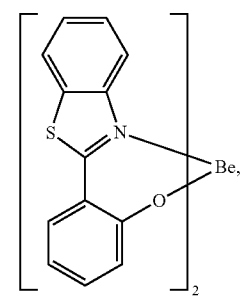
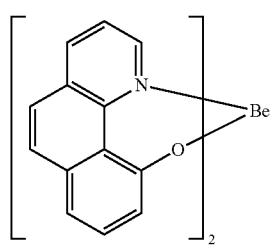
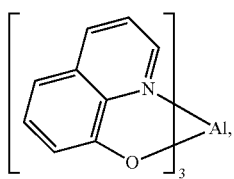
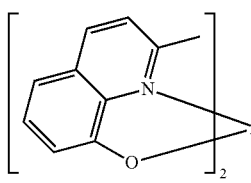
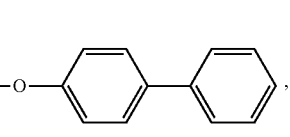

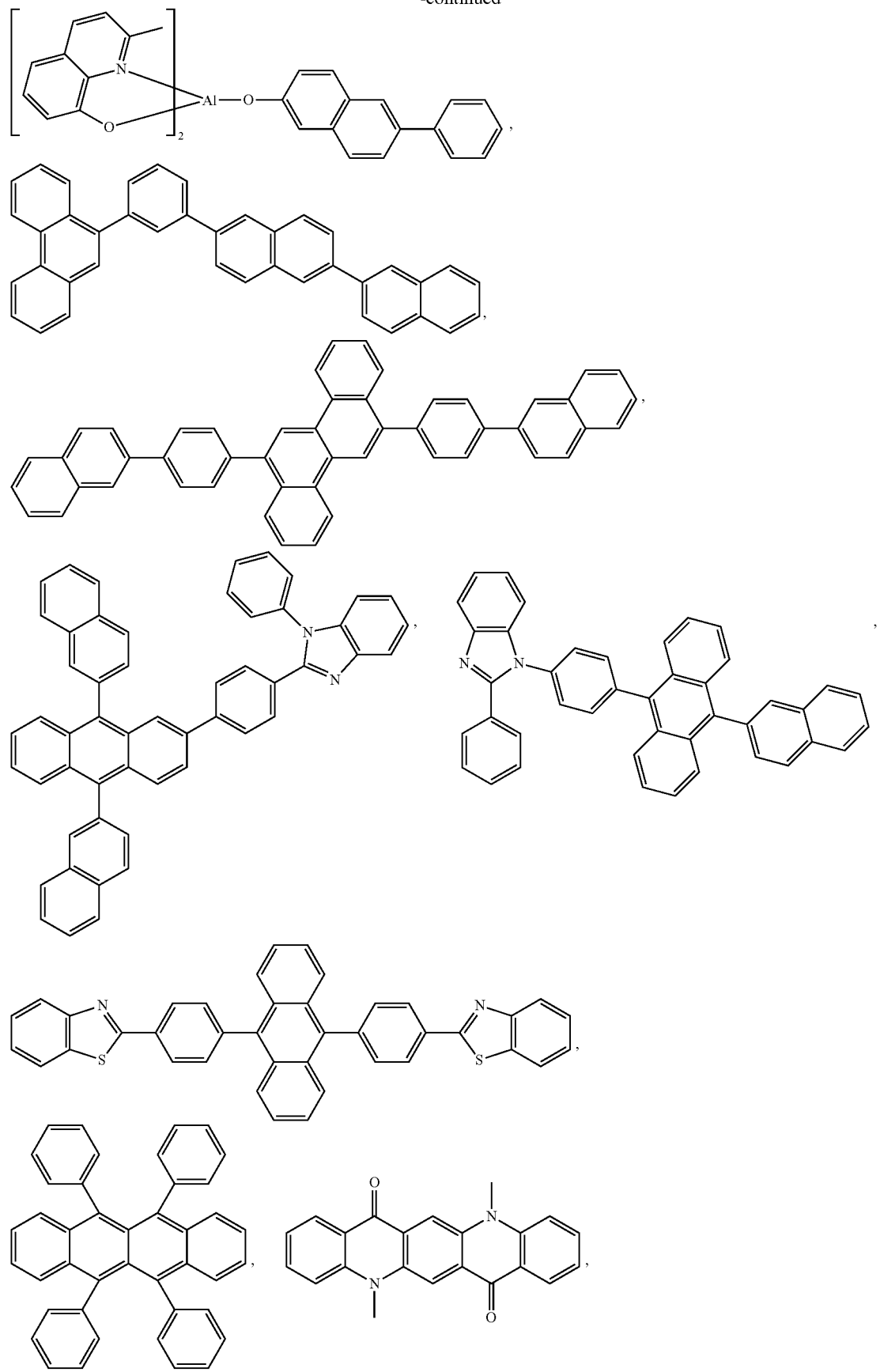

-continued

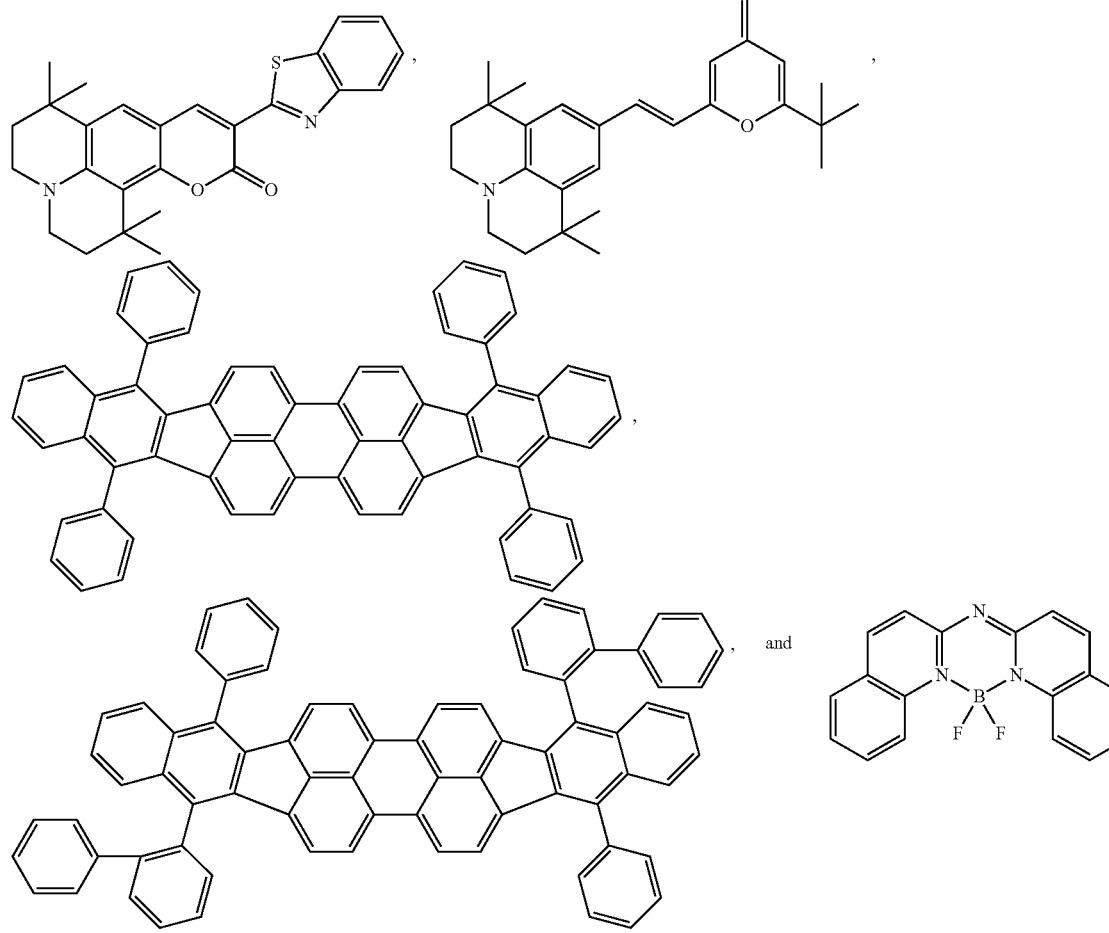

The non-emitting quenching material can make up any suitable quantity of the exciton quenching layer. In some embodiments, the non-emitting quenching material makes up from 1 to 30 percent by weight, or from 3 to 20 percent by weight, or from 5 to 10 percent by weight, of the exciton quenching layer. In some embodiments, the exciton quenching layer is a hole blocking layer. In such embodiments, the non-emitting quenching material makes up from 1 to 30 percent by weight, or from 3 to 20 percent by weight, or from 5 to 10 percent by weight, of the hole blocking layer.

In a second aspect, the invention provides a light emitting device, comprising: a first electrode; a second electrode; a light emitting layer disposed between the first electrode and the second electrode, wherein the light emitting layer comprises an emitting material; and an exciton quenching layer disposed between the light emitting layer and the second electrode, wherein the exciton quenching layer comprises water molecules; wherein the exciton quenching layer is disposed adjacent to the light emitting layer; and wherein the emitting material emits by phosphorescence or delayed fluorescence.

In another aspect, the invention provides a method of making a light emitting device, comprising: depositing a first electrode; depositing a second electrode; depositing a light emitting layer disposed between the first electrode and the second electrode, wherein the light emitting layer comprises an emitting material having a first triplet energy level (T1); and depositing an exciton quenching layer disposed between the light emitting layer and the second electrode, wherein the exciton quenching layer comprises a non-emitting quenching material having a second triplet energy level (T1); wherein the exciton quenching layer is disposed adjacent to the light emitting layer; wherein the emitting material emits by phosphorescence or delayed fluorescence; and wherein the first triplet energy level (T1) is higher than the second triplet energy level (T1).

In another aspect, the invention provides a method for making a light emitting device, comprising: depositing a first electrode; depositing a second electrode; depositing a light emitting layer disposed between the first electrode and the second electrode, wherein the light emitting layer comprises an emitting material; and depositing an exciton quenching layer disposed between the light emitting layer and the second electrode, wherein the exciton quenching layer comprises water molecules; wherein the exciton quenching layer is disposed adjacent to the light emitting layer; and wherein the emitting material emits by phosphorescence or delayed fluorescence.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
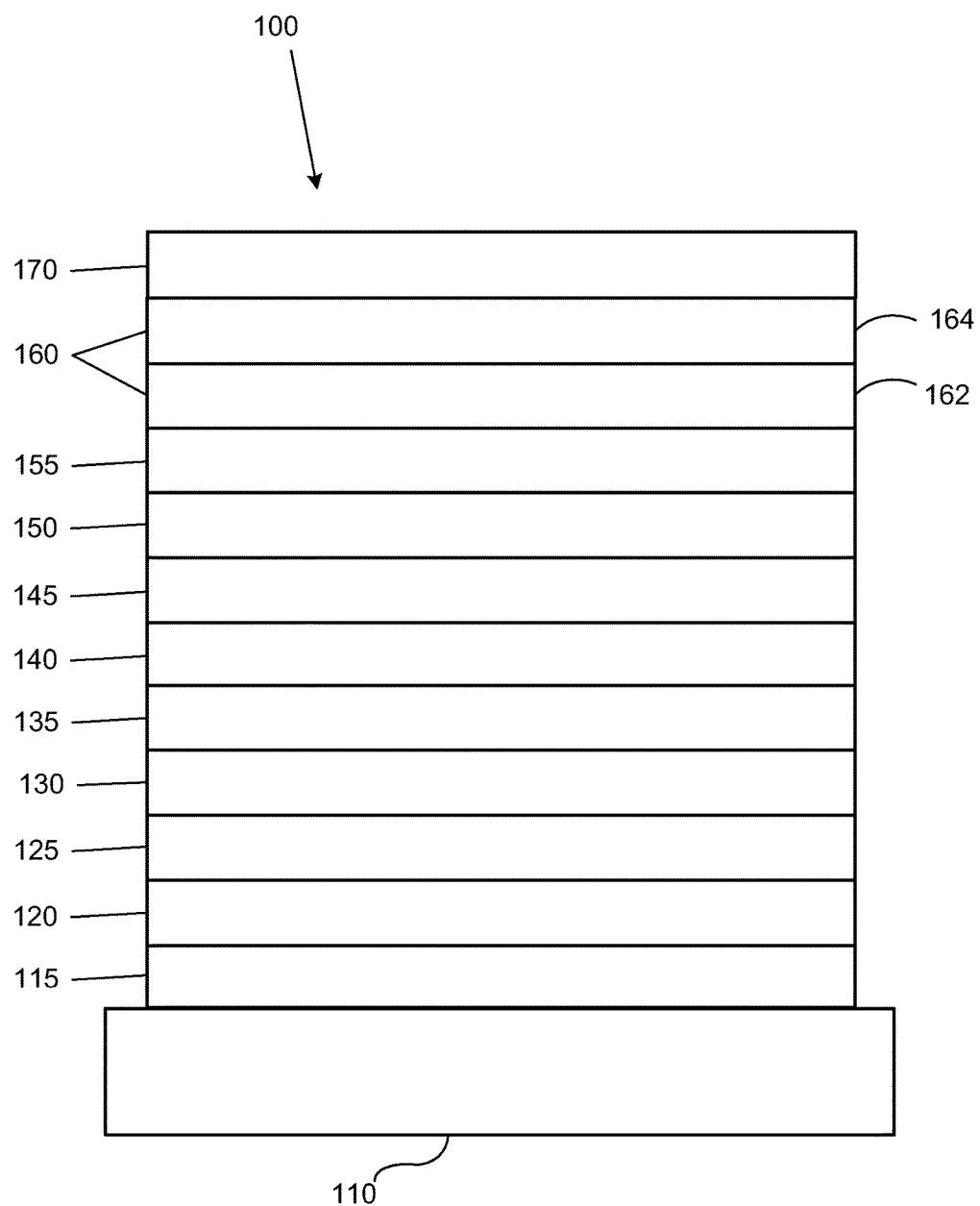
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
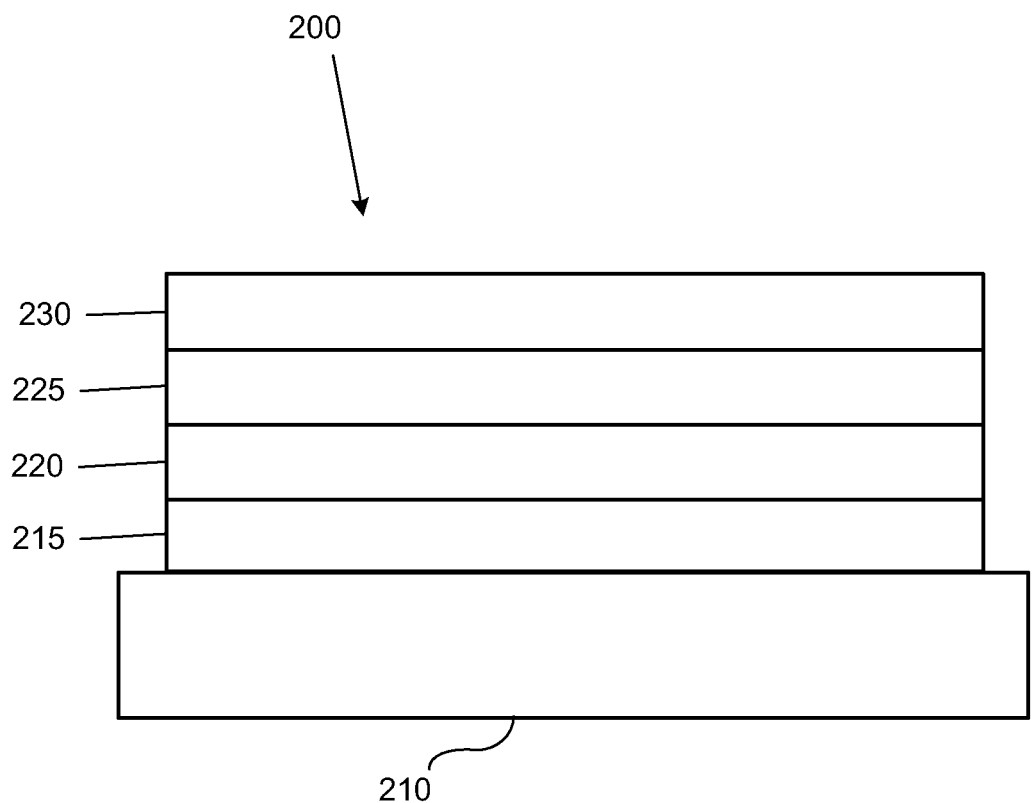
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention may be incorporated into a wide variety of consumer products, including flat panel displays, computer monitors, medical monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

One of the shortcomings of active-matrix OLED (AMO-LED) displays driven by poly-Si TFTs is that it is difficult to control low gray scales with high accuracy due to the sub-threshold current having an exponential function, and non-uniformity of the threshold voltage of the driving transistors. In particular, higher resolution display devices require lower driving current for each subpixel, where the leakage current of the driving transistors can cause partially-lit pixels in the required off-state.

The introduction of an exciton quenching layer next to the light emitting layer (EML) in the OLED can prevent the device from being too efficient at low luminance levels while having high efficiency at higher luminance levels. It can provide more accurate control in the lower brightness region without a significant reduction in power efficiency of the display.

The invention provides novel OLED device architecture designs for highly accurate gray scales in display panels. For lower gray scales, OLEDs require low currents which correspond to the sub-threshold current level of the driving transistors. Because the sub-threshold current is an exponential function of the gate voltage controlled by display data, minor changes in threshold voltages of the transistors and/or non-uniformity of the transistor performance can make significant changes in brightness in the low gray scales. In an extreme case, for example, the transistor's leakage current can supply a driving current to OLEDs. These circumstances can cause wrongly-addressed OLEDs: wrong-gray-scale and partially-lit pixels. In order to address these issues this invention describes a new OLED device structure. This novel device structure has a modified efficiency-luminance correlation with low device efficiency at a low luminance level with high efficiency at a high luminance level. This can be achieved by adding an exciton quenching layer (QL) next to light emitting layer (EML). The OLED devices with this efficiency-luminance correlation can provide a higher level of gray scale control in OLED displays.

As performances of OLED devices (e.g., PHOLED devices), such as the current efficacy, are improved the driving currents required are reduced. In particular, the driving current level at low brightness decreases significantly for high-resolution displays. For instance, in order to drive an OLED of 100 cd/A at 1 cd/m$^2$ for a 300 dpi display, approximately 24 pA is needed. This order of current corresponds to a sub-threshold current of the driving transistors or the off-state current, depending on the dimensions or performances of the transistors. This low driving current causes technical difficulties in AMOLED displays, because the sub-threshold current is an exponential function of the gate data voltage and the threshold voltage of the driving transistors is not ideally uniform. Due to the former, very fine data voltage difference is required to produce the linear gray scales; in reality, OLEDs can be lit brighter than designed. Similarly, the non-uniformity of the threshold voltage affects illumination of each pixel significantly. In an extreme case, the highly efficient OLEDs can be lit partially in the off-state due to the comparable leakage current of the driving transistors. Therefore, lower luminous efficacy at lower brightness can be preferable to higher efficacy.

In certain embodiments of the invention, the desirable shape of efficiency vs. luminance plot for an OLED device for an AMOLED application is low efficiency at low luminance (~1 nit) and high efficiency in the high luminance range (e.g. 3,000 nits). This is designed in order to avoid gray scale emission in the off state (due to imperfection of the AMOLED driving circuit which has a small leakage current in the off state), and have high device efficiency in the on state to reduce the display power consumption.

In many device architectures, holes are more mobile than electrons in organic OLED materials. With a bias applied to the device, the hole injection into the device EML typically occurs earlier than electron injection. This can cause the formation of the recombination zone (RZ) in the device EML at the ETL side of the emissive layer. With increasing bias more electrons are injected into the EML and the RZ propagates away from the ETL side to the middle of the EML toward the HTL side (or broadens). If a thin layer of quencher is introduced next to the ETL side of the EML, then, at low luminance, a large portion of the excitons generated at the ETL side of the EML will be quenched by the quencher. With increased current the RZ propagates inside the EML away from the ETL side i.e. away from the quencher layer, therefore proportionally less quenching occurs, and the device efficiency increases at higher luminance levels.

As used herein, the term "emissive" refers to a material property, and means that a material is capable of light emission. In contrast, as used herein, the term "emitting" refers to an emissive material that actually emits light in the particular device structure. As used herein, the term "non-emitting" refers to a material that contributes less than 5% of the emitted light in the device structure described. A "non-emitting" material can be an "emissive" material, and can also be an "emitting" material in other contexts or device structures. As used herein, the term "adjacent to" means that a layer is sufficiently close to another layer such that an exciton can hop, for example, from the light emitting layer to the exciton quenching layer. In general, exciton hopping distances can range up to 10 to 30 Å. As used herein in the context of this disclosure, the term "delayed fluorescence" refers to both P-type delayed fluorescence and E-type delayed fluorescence. P-type delayed fluorescence is generated from triplet-triplet annihilation (TTA). E-type delayed fluorescence does not rely on the collision of two triplets. It relies on the thermal conversion between the single and triplet state.

Figure 11:
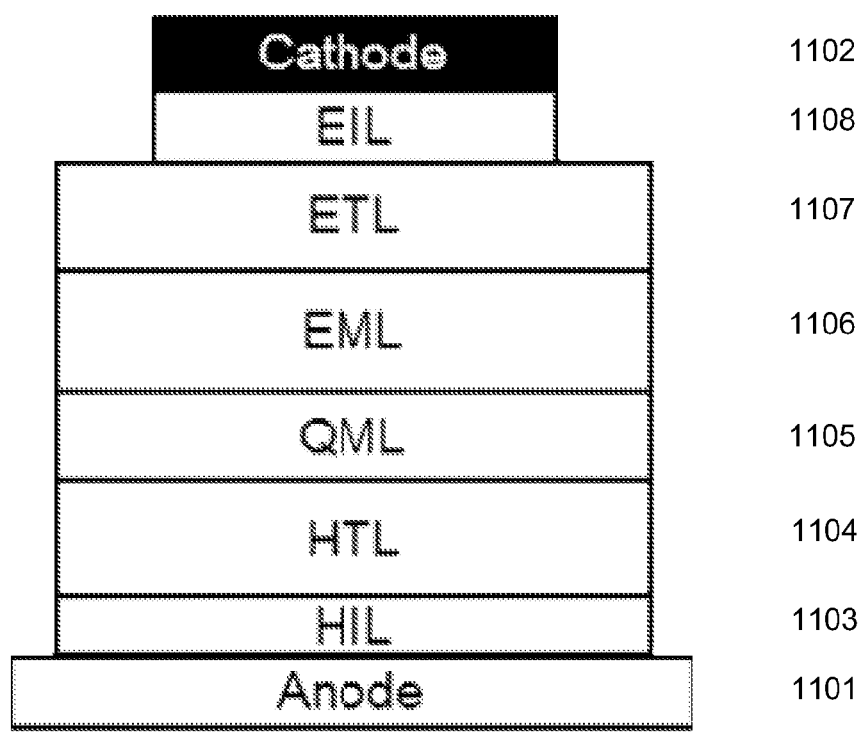
FIG. 11 shows a schematic device structure having an exciton quenching layer disposed between the light emitting layer and the hole transporting layer.
Figure 12:
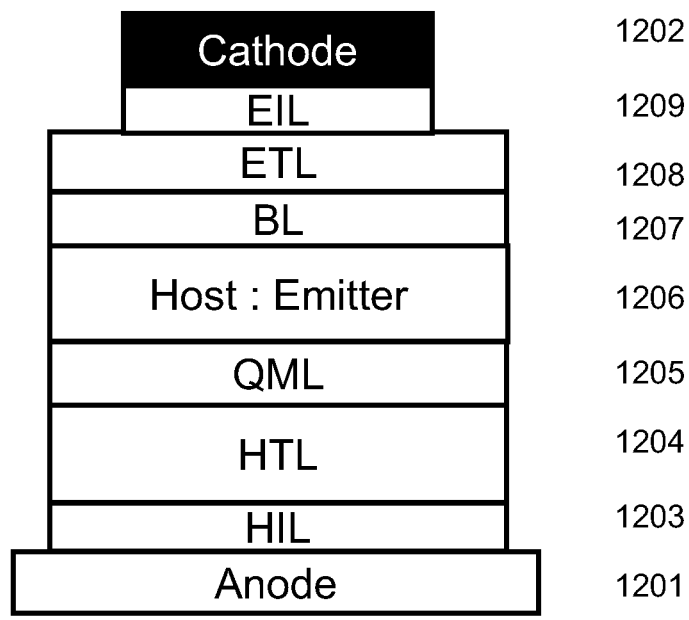
FIG. 12 shows a schematic device structure having an exciton quenching layer disposed between the light emitting layer and the anode.

OLED devices having highly accurate gray scales in their display panels are provided. In at least one aspect, the invention provides a light emitting device, comprising: a first electrode; a second electrode; a light emitting layer disposed between the first electrode and the second electrode, wherein the light emitting layer comprises an emitting material having a first triplet energy level (T1); and an exciton quenching layer disposed between the light emitting layer and the second electrode, wherein the exciton quenching layer comprises a non-emitting quenching material having a second triplet energy level (T1); wherein the exciton quenching layer is disposed adjacent to the light emitting layer; wherein the emitting material emits by phosphorescence or delayed fluorescence; and wherein the first triplet energy level (T1) is higher than the second triplet energy level (T1). In some embodiments, the first electrode is an anode and the second electrode is a cathode. In other embodiments, the first electrode is a cathode and the second electrode is an anode. For example, FIG. 11 shows a schematic device structure 1100 having an anode 1101, a cathode 1102, a hole injection layer 1103, a hole transport layer 1104, an exciton quenching layer 1105, a light emitting layer 1106, an electron transport layer 1107, and an electron injection layer 1108. FIG. 12 shows a schematic device structure 1200 having an anode 1201, a cathode 1202, a hole injection layer 1203, a hole transport layer 1204, an exciton quenching layer 1205, a light emitting layer 1206 consisting of a host doped with a light emitting material, a hole blocking layer 1207, an electron transport layer 1208, and an electron injection layer 1209.

Figure 13:
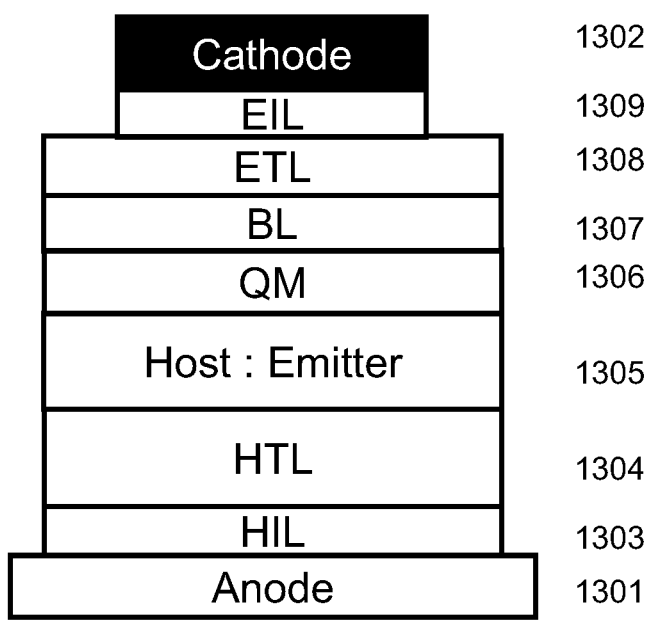
FIG. 13 shows a schematic device structure having an exciton quenching layer that consists essentially of the quenching material.
Figure 14:
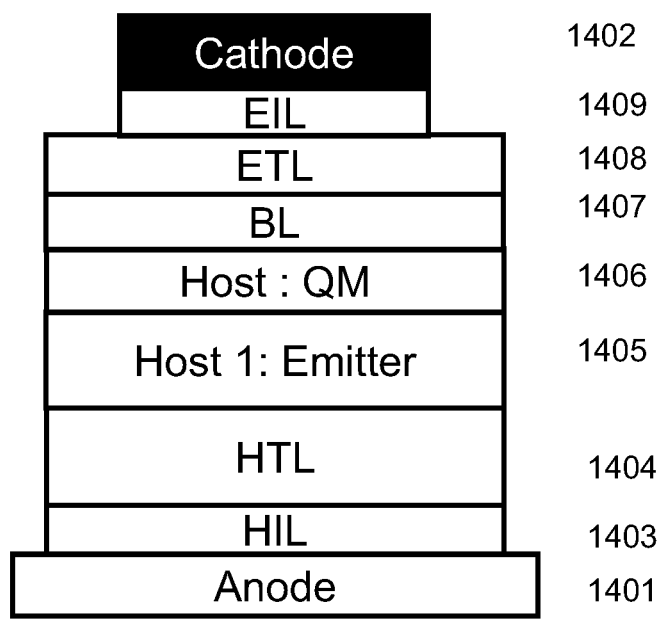
FIG. 14 shows a schematic device structure having an exciton quenching layer that consists of a host doped with a non-emitting quenching material.
Figure 16:
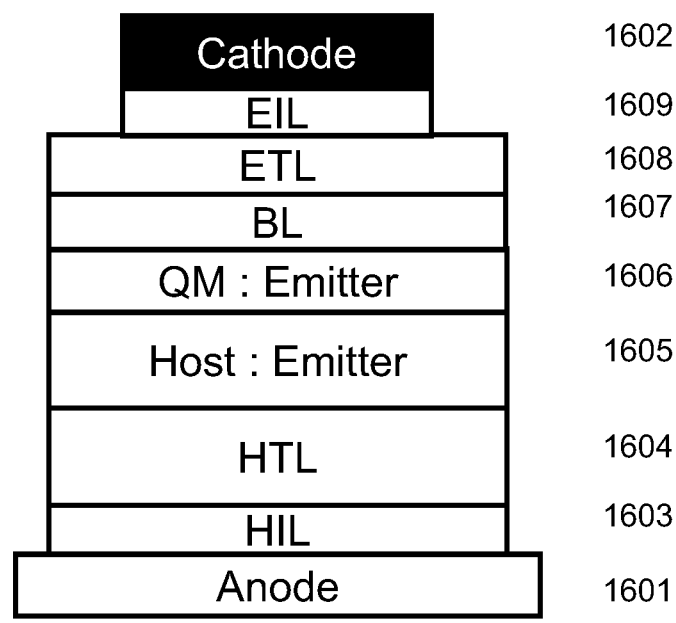
FIG. 16 shows a schematic device structure having a light emitting material in the exciton quenching layer.
Figure 17:
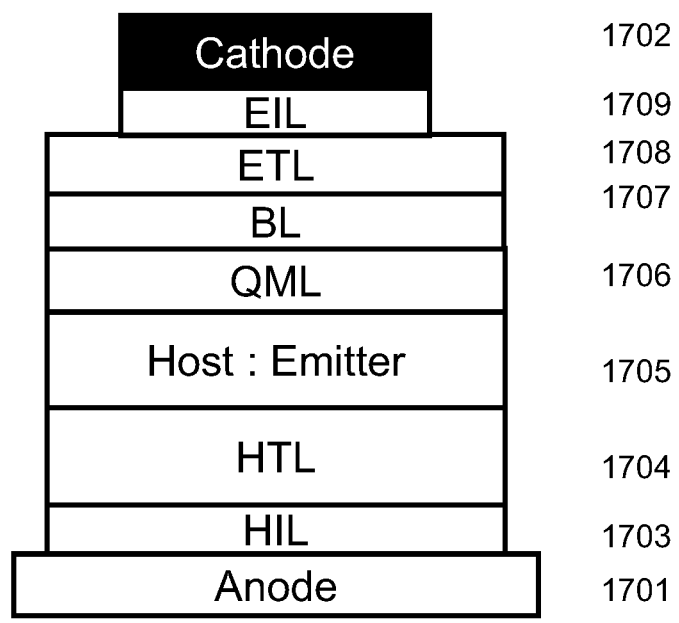
FIG. 17 shows a schematic device structure having an exciton quenching layer that does not comprise a light emitting material.

The exciton quenching layer at least comprises a non-emitting quenching material. In some embodiments, the exciton quenching layer consists essentially of a non-emitting quenching material. In some embodiments, the exciton quenching layer comprises a host doped with a non-emitting quenching material. The exciton quenching layer can, in some embodiments, also include an emitting material. In other embodiments, however, the exciton quenching layer does not comprise an emitting material. FIG. 13 shows a schematic device structure 1300 having an anode 1301, a cathode 1302, a hole injection layer 1303, a hole transport layer 1304, a light emitting layer 1305, an exciton quenching layer 1306 consisting essentially of a host doped with a non-emitting quenching material, a hole blocking layer 1307, an electron transport layer 1308, and an electron injection layer 1309. FIG. 14 shows a schematic device structure 1400 having an anode 1401, a cathode 1402, a hole injection layer 1403, a hole transport layer 1404, a light emitting layer 1405, an exciton quenching layer 1406 consisting of a host doped with a non-emitting quenching material, a hole blocking layer 1407, an electron transport layer 1408, and an electron injection layer 1409. FIG. 16 shows a schematic device structure 1600 having an anode 1601, a cathode 1602, a hole injection layer 1603, a hole transport layer 1604, a light emitting layer 1605, an exciton quenching layer 1606 that also comprises an emissive material, a hole blocking layer 1607, an electron transport layer 1608, and an electron injection layer 1609. FIG. 17 shows a schematic device structure 1700 having an anode 1701, a cathode 1702, a hole injection layer 1703, a hole transport layer 1704, a light emitting layer 1705, an exciton quenching layer 1706 that does not comprise an emissive material, a hole blocking layer 1707, an electron transport layer 1708, and an electron injection layer 1709.

Figure 15:
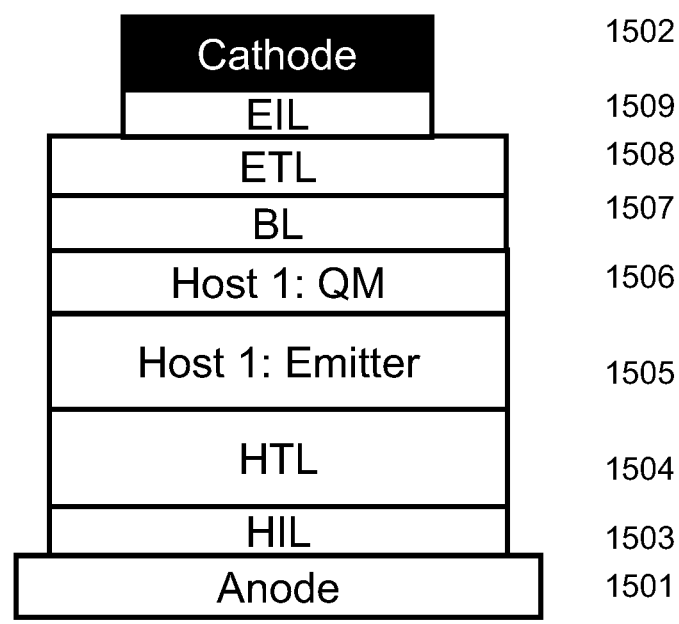
FIG. 15 shows a schematic device structure having the same host used in the light emitting layer and the exciton quenching layer.
Figure 18:
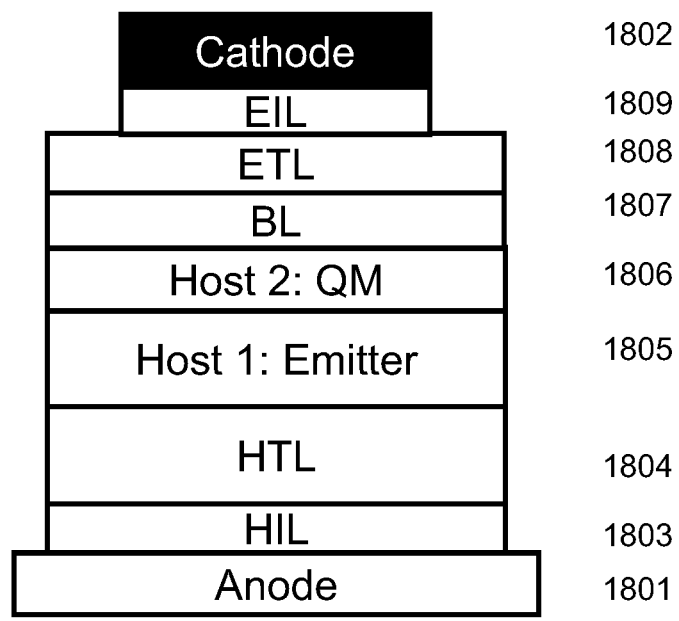
FIG. 18 shows a schematic device structure having different host materials used in the light emitting layer and the exciton quenching layer.

The light emitting layer at least comprises an emitting material. In some embodiments, the light emitting layer comprises a host doped with the emitting material. The host can be the same or different from the host that can be employed in the exciton quenching layer. In some embodiments where the light emitting layer and the exciton quenching layer both comprise a host, the hosts are the same. In some other embodiments, the hosts are different. FIG. 15 shows a schematic device structure 1500 having an anode 1501, a cathode 1502, a hole injection layer 1503, a hole transport layer 1504, a light emitting layer 1505 comprising a host, an exciton quenching layer 1506 comprising the same host as that used in the light emitting layer 1505, a hole blocking layer 1507, an electron transport layer 1508, and an electron injection layer 1509. FIG. 18 shows a schematic device structure 1800 having an anode 1801, a cathode 1802, a hole injection layer 1803, a hole transport layer 1804, a light emitting layer 1805 comprising a host, an exciton quenching layer 1806 comprising a different host from that used in the light emitting layer 1805, a hole blocking layer 1807, an electron transport layer 1808, and an electron injection layer 1809.

Figure 9:
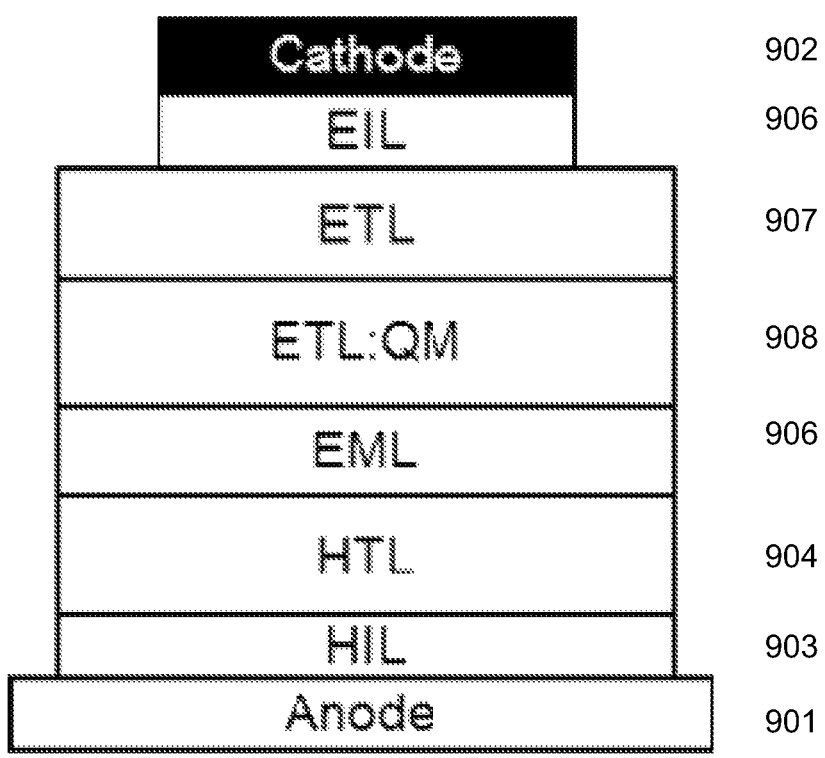
FIG. 9 shows a schematic device structure where the exciton quenching layer is an electron transporting layer doped with a non-emitting quenching material, and disposed adjacent to the light emitting layer.
Figure 10:
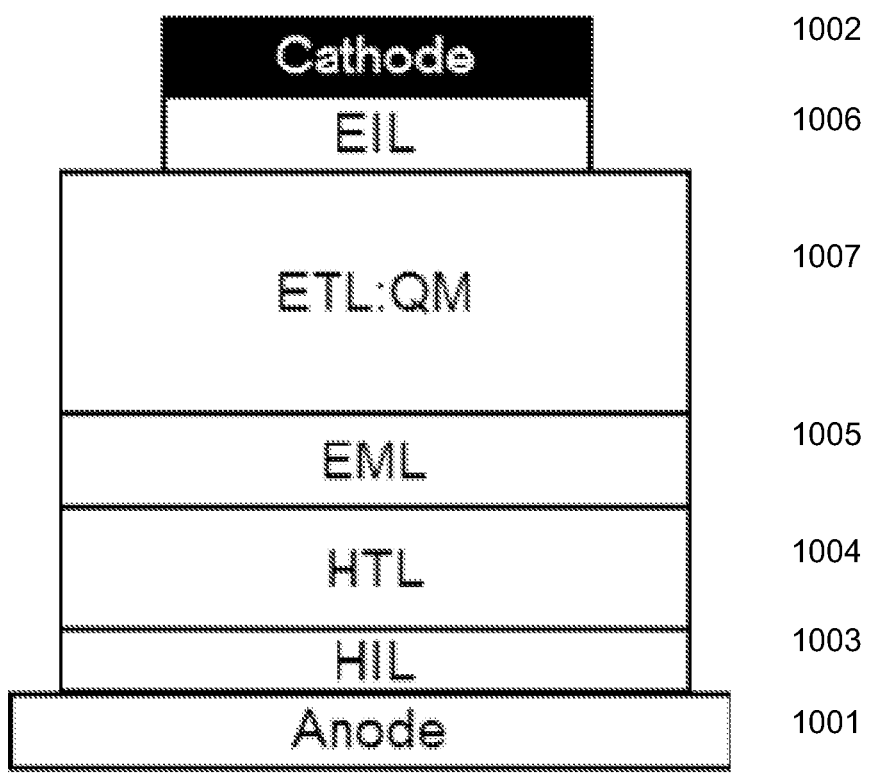
FIG. 10 shows a schematic device structure where the exciton quenching layer is an electron transporting layer doped with a non-emitting quenching material, and disposed adjacent to the light emitting layer.

The device can also include other layers. For example, in some embodiments, the light emitting device comprises an electron transport layer disposed between the exciton quenching layer and the cathode. In embodiments where the exciton quenching layer lies on the opposite side of the light emitting layer from the cathode, the electron transport layer is disposed between the cathode and the light emitting layer. In embodiments where the exciton quenching layer lies on the same side of the light emitting layer as the cathode, the electron transport layer is disposed adjacent to the exciton quenching layer. FIG. 9 shows a schematic device structure 900 having an anode 901, a cathode 902, a hole injection layer 903, a hole transporting layer 904, a light emitting layer 905, an electron injection layer 906, an electron transporting layer 907, and an exciton quenching layer 908 that is an electron transporting material doped with a non-emitting quenching material (QM). FIG. 10 shows a schematic device structure 1000 having an anode 1001, a cathode 1002, a hole injection layer 1003, a hole transporting layer 1004, a light emitting layer 1005, an electron injection layer 1006, and an exciton quenching layer 1007 that is an electron transporting material doped with a non-emitting quenching material (QM).

In some further embodiments where the exciton quenching layer lies on the same side of the light emitting layer as the cathode, the light emitting device comprises a hole blocking layer that is disposed between the electron transport layer and the exciton quenching layer. In some such embodiments, the hole blocking layer is disposed directly adjacent to the exciton quenching layer. In some embodiments, the hole blocking layer comprises (or is doped with) a non-emitting quenching material. In some embodiments, the exciton quenching layer is a hole blocking layer doped with the non-emitting quenching material.

In certain embodiments of the invention, the emitting material in the light emitting layer has a higher triplet energy (T1) than that of the non-emitting quenching material. The device can employ any suitable difference in triplet energies between these two materials. In some embodiments, the difference is 0.1 to 1.5 eV, or 0.1 to 1.0 eV, or 0.1 to 0.6 eV.

Further, the exciton quenching layer can have any suitable thickness. For example, the exciton quenching layer can have a thickness ranging from 0.5 to 50 Å, or from 1 to 20 Å, or from 2 to 12 Å.

In embodiments of the invention, the luminous efficacy of the device is higher at higher luminance. For example, in some embodiments, the ratio of the luminous efficacy at 3000 nits to the luminous efficacy at 1 nit is at least 1.0, e.g., 1.0 to 10.0, or 1.5 to 5.5, or 2.0 to 5.0, or 2.5 to 4.0. In some such embodiments, the light emitting material in the device emits green light. In some other embodiments, the luminous efficacy at 800 nits to the luminous efficacy at 1 nit is at least 1.0, e.g., 1.0 to 10.0, or 1.5 to 5.5, or 2.0 to 5.0, or 2.5 to 4.0. In some such embodiments, the light emitting material emits red or blue light. In some embodiments where the device emits green light, the luminous efficacy of the device at 1 nit ranges from 1 to 50 cd/A, or from 3 to 40 cd/A, or from 5 to 25 cd/A, or from 5 to 15 cd/A. In some embodiments where the device emits red or blue light, the luminous efficacy at 1 nit ranges from 0.2 to 13 cd/A, or from 0.8 to 11 cd/A, or from 1.3 to 7 cd/A, or from 1.3 to 4 cd/A.

The invention can employ any suitable non-emitting quenching material. In some embodiments, the non-emitting quenching material is an electron transporter. In some embodiments, the non-emitting quenching material is a metal complex, for example, a metal complex with aluminum, beryllium, or zinc. In some other embodiments, the non-emitting quenching material is a polycyclic aromatic compound. In some embodiments, the non-emitting quenching material is selected from a class represented by one or more of the following compounds:

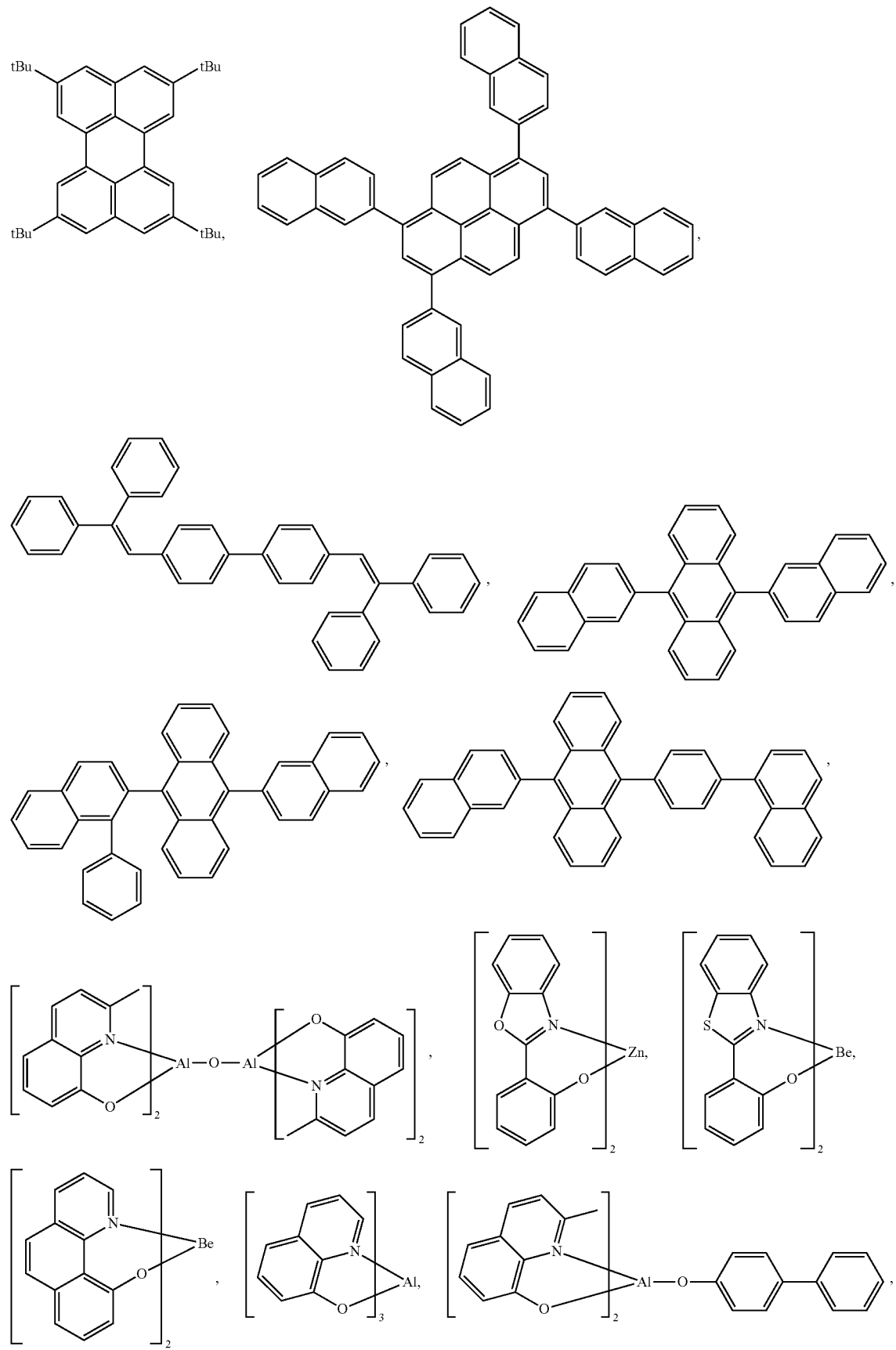

-continued
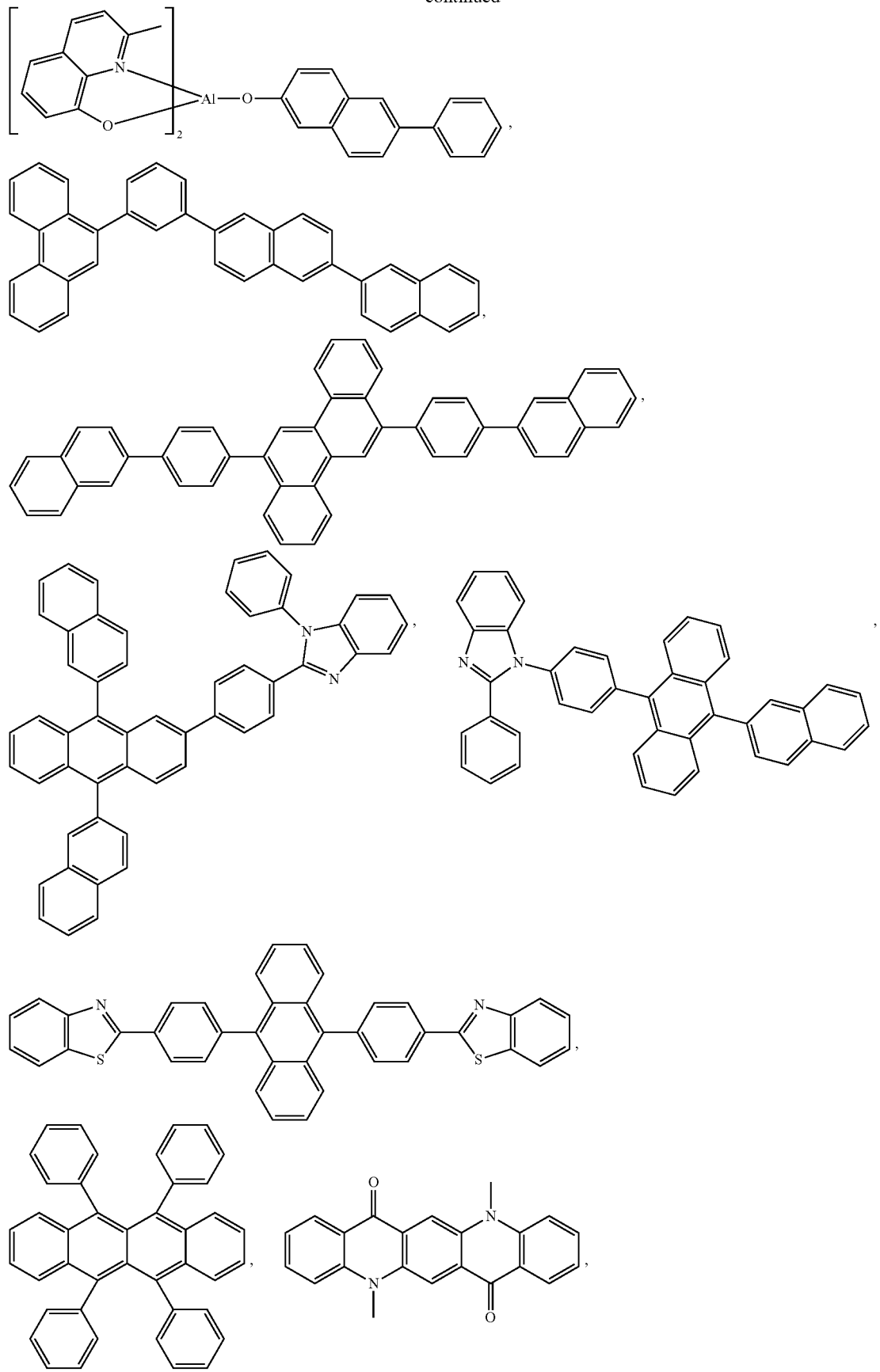

-continued

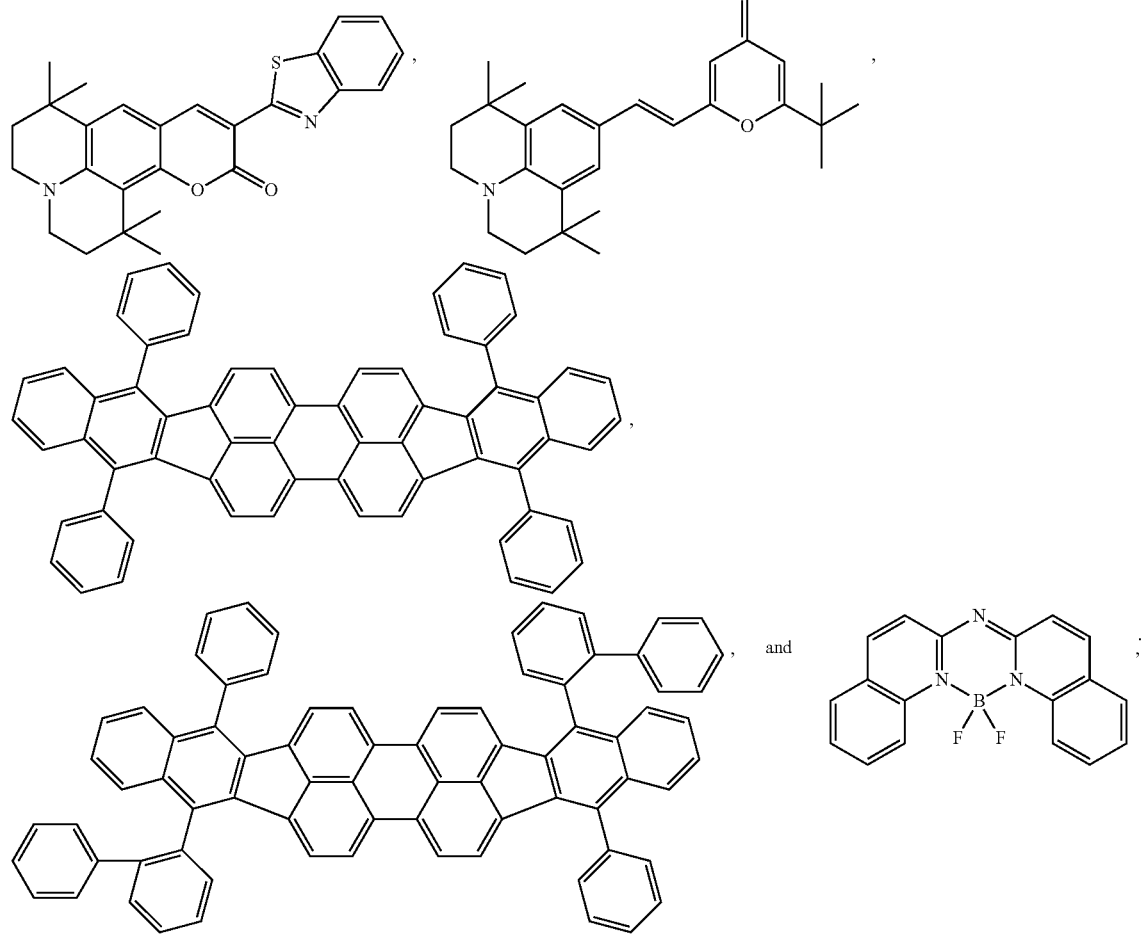

In some embodiments, the non-emitting quenching material is selected from the group consisting of the aforementioned compounds.

The non-emitting quenching material can make up any suitable quantity of the exciton quenching layer. In some embodiments, the non-emitting quenching material makes up from 1 to 30 percent by weight, or from 3 to 20 percent by weight, or from 5 to 10 percent by weight, of the exciton quenching layer. In some embodiments, the exciton quenching layer is a hole blocking layer. In such embodiments, the non-emitting quenching material makes up from 1 to 30 percent by weight, or from 3 to 20 percent by weight, or from 5 to 10 percent by weight, of the hole blocking layer.

In a second aspect, the invention provides a light emitting device, comprising: a first electrode; a second electrode; a light emitting layer disposed between the first electrode and the second electrode, wherein the light emitting layer comprises an emitting material; and an exciton quenching layer disposed between the light emitting layer and the second electrode, wherein the exciton quenching layer comprises water molecules; wherein the exciton quenching layer is disposed adjacent to the light emitting layer; and wherein the emitting material emits by phosphorescence or delayed fluorescence. The water molecules can be present in any suitable concentration. In some embodiments, the exciton quenching layer comprises from $1 \times 10^{11}$ to $1 \times 10^{15}$, or from $1 \times 10^{11}$ to $1 \times 10^{12}$ water molecules per cm$^2$ of device area.

In another aspect, the invention provides a method of making a light emitting device, comprising: depositing a first electrode; depositing a second electrode; depositing a light emitting layer disposed between the first electrode and the second electrode, wherein the light emitting layer comprises an emitting material having a first triplet energy level (T1); and depositing an exciton quenching layer disposed between the light emitting layer and the second electrode, wherein the exciton quenching layer comprises a non-emitting quenching material having a second triplet energy level (T1); wherein the exciton quenching layer is disposed adjacent to the light emitting layer; wherein the emitting material emits by phosphorescence or delayed fluorescence; and wherein the first triplet energy level (T1) is higher than the second triplet energy level (T1). The steps need not be performed in the order recited. In some embodiments, the steps are not performed in the order recited.

In another aspect, the invention provides a method for making a light emitting device, comprising: depositing a first electrode; depositing a second electrode; depositing a light emitting layer disposed between the first electrode and the second electrode, wherein the light emitting layer comprises an emitting material; and depositing an exciton quenching layer disposed between the light emitting layer and the second electrode, wherein the exciton quenching layer comprises water molecules; wherein the exciton quenching layer is disposed adjacent to the light emitting layer; and wherein the emitting material emits by phosphorescence or delayed fluorescence. The water molecules can be present in any suitable concentration. In some embodiments, the exciton quenching layer comprises from $1\times10^{11}$ to $1\times10^{15}$, or from $1\times10^{12}$ to $1\times10^{14}$ water molecules per $cm^2$ of device area. The steps need not be performed in the order recited. In some embodiments, the steps are not performed in the order recited.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

HIL/HTL:

A hole injecting/transporting material to be used in the present invention is not particularly limited, and any compound may be used as long as the compound is typically used as a hole injecting/transporting material. Examples of the material include, but not limit to: a phthalocyanine or porphyrin derivative; an aromatic amine derivative; an indolocarbazole derivative; a polymer containing fluorohydrocarbon; a polymer with conductivity dopants; a conducting polymer, such as PEDOT/PSS; a self-assembly monomer derived from compounds such as phosphonic acid and silane derivatives; a metal oxide derivative, such as $MoO_x$; a p-type semiconducting organic compound, such as 1,4,5,8,9,12-Hexaazatriphenylenehexacarbonitrile; a metal complex, and a cross-linkable compounds.

Examples of aromatic amine derivatives used in HIL or HTL include, but not limit to the following general structures:

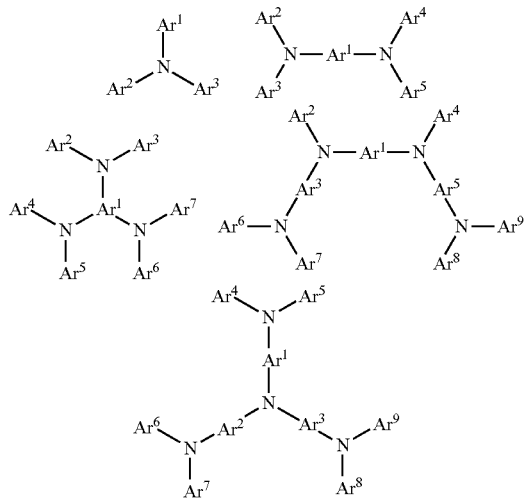

Each of $Ar^1$ to $Ar^9$ is selected from the group consisting aromatic hydrocarbon cyclic compounds such as benzene, biphenyl, triphenyl, triphenylene, naphthalene, anthracene, phenalene, phenanthrene, fluorene, pyrene, chrysene, perylene, azulene; group consisting aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and group consisting 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Wherein each Ar is further substituted by a substituent selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof.

In one aspect, $Ar^1$ to $Ar^9$ is independently selected from the group consisting of:

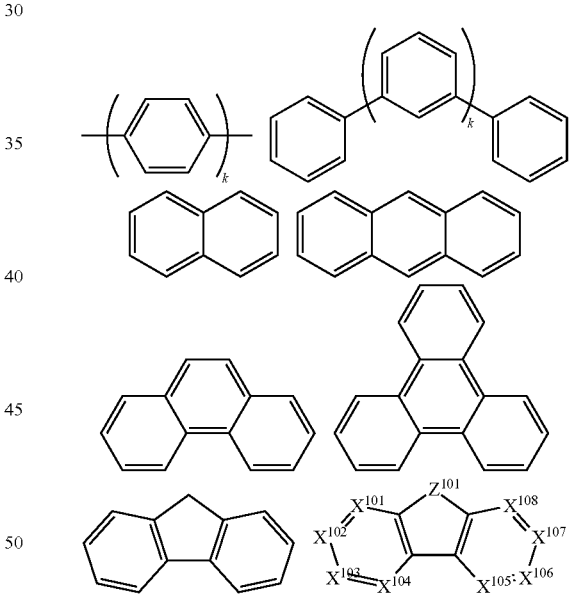

k is an integer from 1 to 20; $X^{101}$ to $X^{108}$ is C (including CH) or N; $Z^{101}$ is $NAr^1$, O, or S; $Ar^1$ has the same group defined above.

Examples of metal complexes used in HIL or HTL include, but not limit to the following general formula:

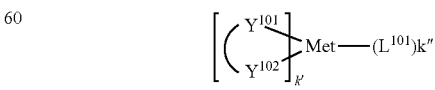

Met is a metal; ($Y^{101}$-$Y^{102}$) is a bidentate ligand, $Y^{101}$ and $Y^{102}$ are independently selected from C, N, O, P, and S; $L^{101}$ is another ligand; k' is an integer value from 1 to the maximum number of ligands that may be attached to the metal; and k'+k" is the maximum number of ligands that may be attached to the metal.

In one aspect, $(Y^{101}-Y^{102})$ is a 2-phenylpyridine derivative.

In another aspect, $(Y^{101}-Y^{102})$ is a carbene ligand.

In another aspect, Met is selected from Ir, Pt, Os, and Zn.

In a further aspect, the metal complex has a smallest oxidation potential in solution vs. Fc$^+$/Fc couple less than about 0.6 V.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. While the Table below categorizes host materials as preferred for devices that emit various colors, any host material may be used with any dopant so long as the triplet criteria is satisfied.

Examples of metal complexes used as host are preferred to have the following general formula:

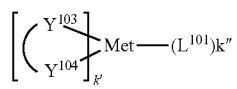

Met is a metal; $(Y^{103}-Y^{104})$ is a bidentate ligand, $Y^{103}$ and $Y^{104}$ are independently selected from C, N, O, P, and S; $L^{101}$ is another ligand; k' is an integer value from 1 to the maximum number of ligands that may be attached to the metal; and k'+k" is the maximum number of ligands that may be attached to the metal.

In one aspect, the metal complexes are:

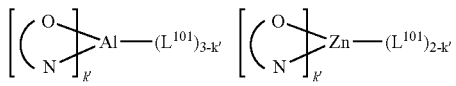

(O—N) is a bidentate ligand, having metal coordinated to atoms O and N.

In another aspect, Met is selected from Ir and Pt.

In a further aspect, $(Y^{103}-Y^{104})$ is a carbene ligand.

Examples of organic compounds used as host are selected from the group consisting aromatic hydrocarbon cyclic compounds such as benzene, biphenyl, triphenyl, triphenylene, naphthalene, anthracene, phenalene, phenanthrene, fluorene, pyrene, chrysene, perylene, azulene; group consisting aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and group consisting 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Wherein each group is further substituted by a substituent selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof.

In one aspect, host compound contains at least one of the following groups in the molecule:

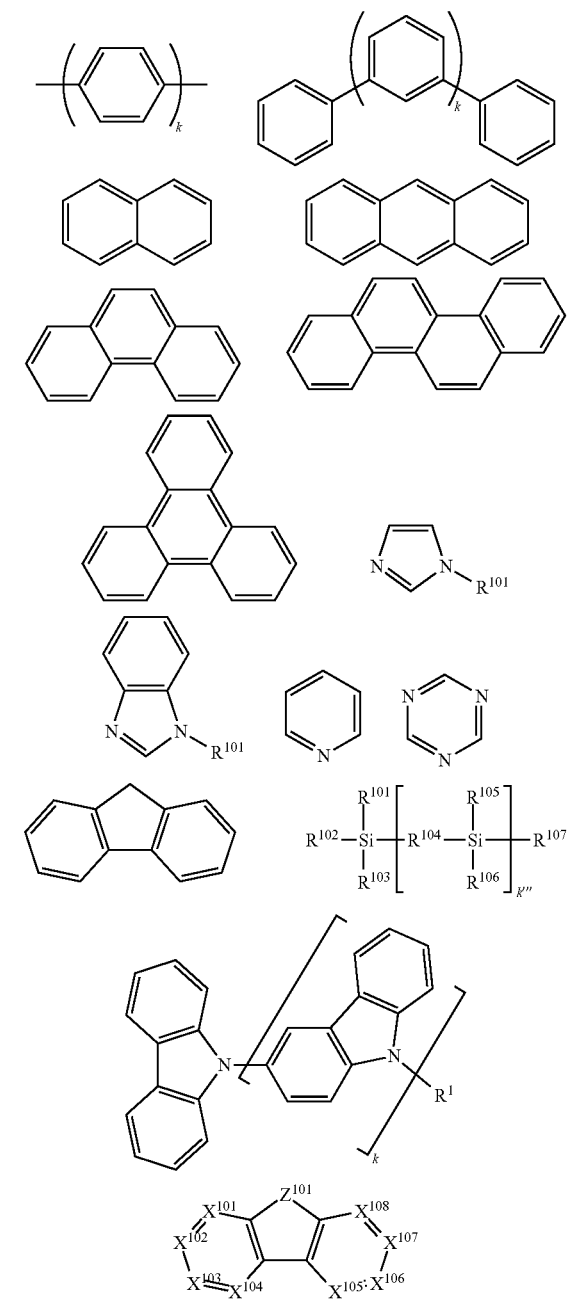

-continued

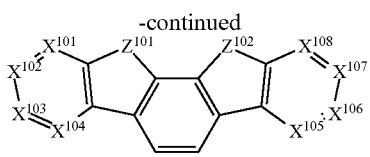

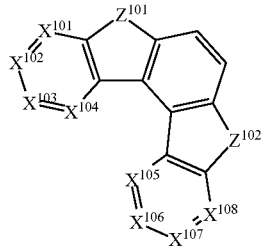

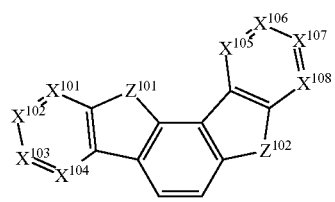

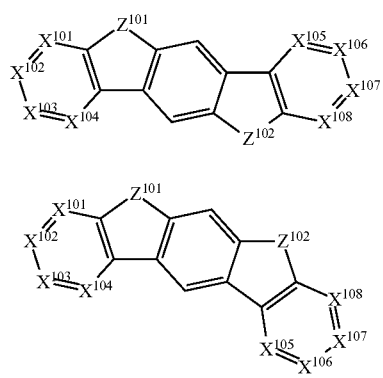

$R^{101}$ to $R^{107}$ is independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof, when it is aryl or heteroaryl, it has the similar definition as Ar's mentioned above.

k is an integer from 1 to 20; k''' is an integer from 0 to 20.

$X^{101}$ to $X^{108}$ is selected from C (including CH) or N.

$Z^{101}$ and $Z^{102}$ is selected from $NR^{101}$, O, or S.

HBL:

A hole blocking layer (HBL) may be used to reduce the number of holes and/or excitons that leave the emissive layer. The presence of such a blocking layer in a device may result in substantially higher efficiencies as compared to a similar device lacking a blocking layer. Also, a blocking layer may be used to confine emission to a desired region of an OLED.

In one aspect, compound used in HBL contains the same molecule or the same functional groups used as host described above.

In another aspect, compound used in HBL contains at least one of the following groups in the molecule:

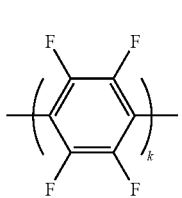
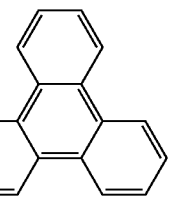
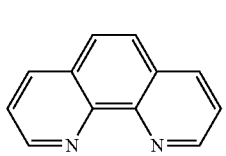
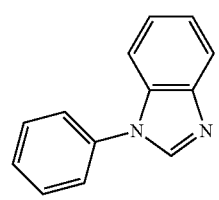
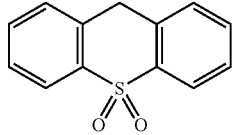

k is an integer from 1 to 20; $L^{101}$ is an another ligand, k' is an integer from 1 to 3.

ETL:

Electron transport layer (ETL) may include a material capable of transporting electrons. Electron transport layer may be intrinsic (undoped), or doped. Doping may be used to enhance conductivity. Examples of the ETL material are not particularly limited, and any metal complexes or organic compounds may be used as long as they are typically used to transport electrons.

In one aspect, compound used in ETL contains at least one of the following groups in the molecule:

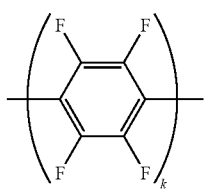
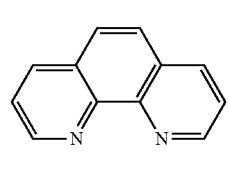
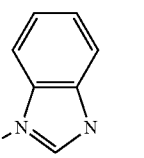
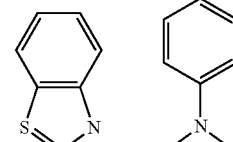
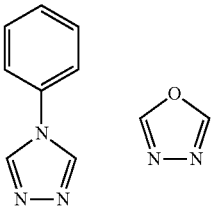
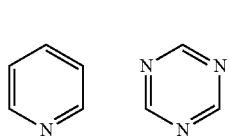
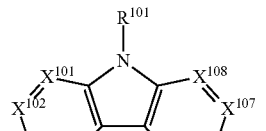
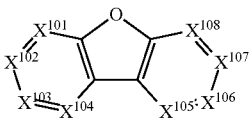
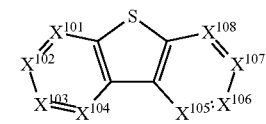

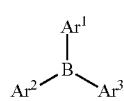

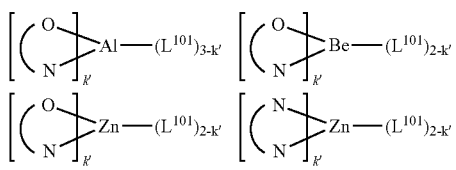

$R^{101}$ is selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof, when it is aryl or heteroaryl, it has the similar definition as Ar's mentioned above.

$Ar^1$ to $Ar^3$ has the similar definition as Ar's mentioned above.

k is an integer from 1 to 20.

$X^{101}$ to $X^{108}$ is selected from C (including CH) or N.

In another aspect, the metal complexes used in ETL contains, but not limit to the following general formula:

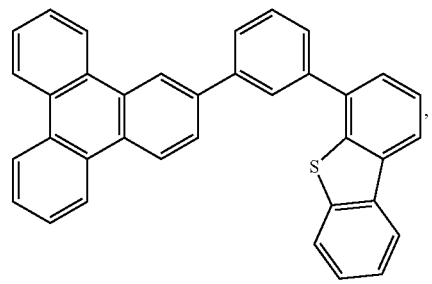

(O—N) or (N—N) is a bidentate ligand, having metal coordinated to atoms O, N or N, N; $L^{101}$ is another ligand; k' is an integer value from 1 to the maximum number of ligands that may be attached to the metal.

In any above-mentioned compounds used in each layer of the OLED device, the hydrogen atoms can be partially or fully deuterated. Thus, any specifically listed substituent, such as, without limitation, methyl, phenyl, pyridyl, etc. encompasses undeuterated, partially deuterated, and fully deuterated versions thereof. Similarly, classes of substituents such as, without limitation, alkyl, aryl, cycloalkyl, heteroaryl, etc. also encompass undeuterated, partially deuterated, and fully deuterated versions thereof.

In addition to and/or in combination with the materials disclosed herein, many hole injection materials, hole transporting materials, host materials, dopant materials, exiton/hole blocking layer materials, electron transporting and electron injecting materials may be used in an OLED.

EXPERIMENTAL

Examples 1 and 2

Figure 3:
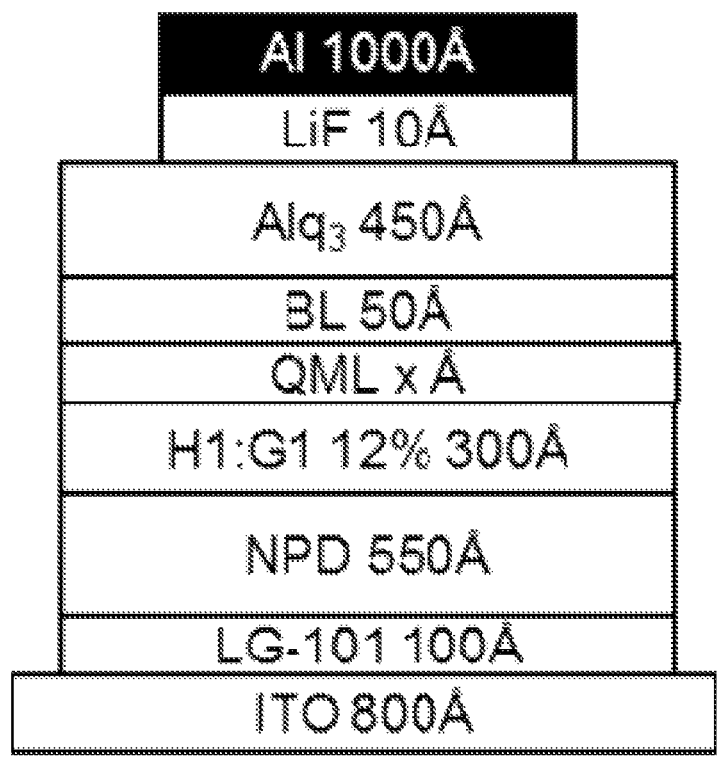
FIG. 3 shows a schematic device structure with an exciton quenching layer between the light emitting layer and a hold blocking layer, as described in Examples 1 and 2.

FIG. 3 shows the schematic for the device structure used for Examples 1 and 2, having an 800 Å ITO anode, a 100 Å LG-101 hole injection layer (purchased from LG Chemical), a 550 Å NPD hole transporting layer, a 300 Å light emitting layer using H1:G1 at 12 percent by weight, an exciton quenching layer, a 50 Å H1 blocking layer, a 450 Å $Alq_3$ electron transporting layer, a 10 Å LiF electron injection layer, and a 1000 Å aluminum cathode. A thin layer of $Alq_3$ quencher was deposited between the light emitting layer and the hole blocking layer. Example 1 employed a 5 Å exciton quenching layer, and Example 2 employed a 10 Å exciton quenching layer. The addition of the exciton quenching layer had a significant quenching of the efficiency at low luminance with reasonably high efficiency at high luminance range (1,000-3,000 nits).

Figure 4:
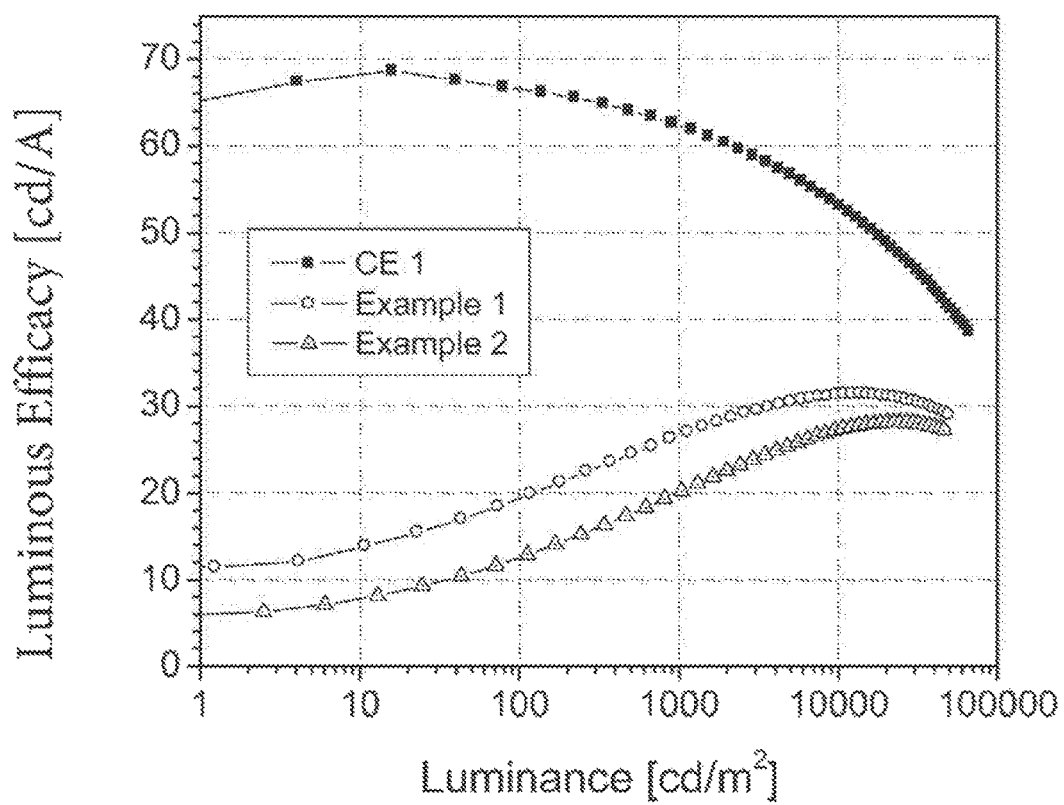
FIG. 4 shows the efficacy-luminance plot for Examples 1 and 2 and Comparative Example 1.

The efficiency vs. luminance curve shape was quantified as a ratio of luminous efficacy at 3,000 nits to that at 1 nit, the results of which are shown in FIG. 4. The results are shown in the Tables 2 and 3 (below). For the Comparative Example 1 (CE1) the ratio is 0.9 whereas in Examples 1 and 2 the ratio is 2.5 and 4.0.

Figure 5:
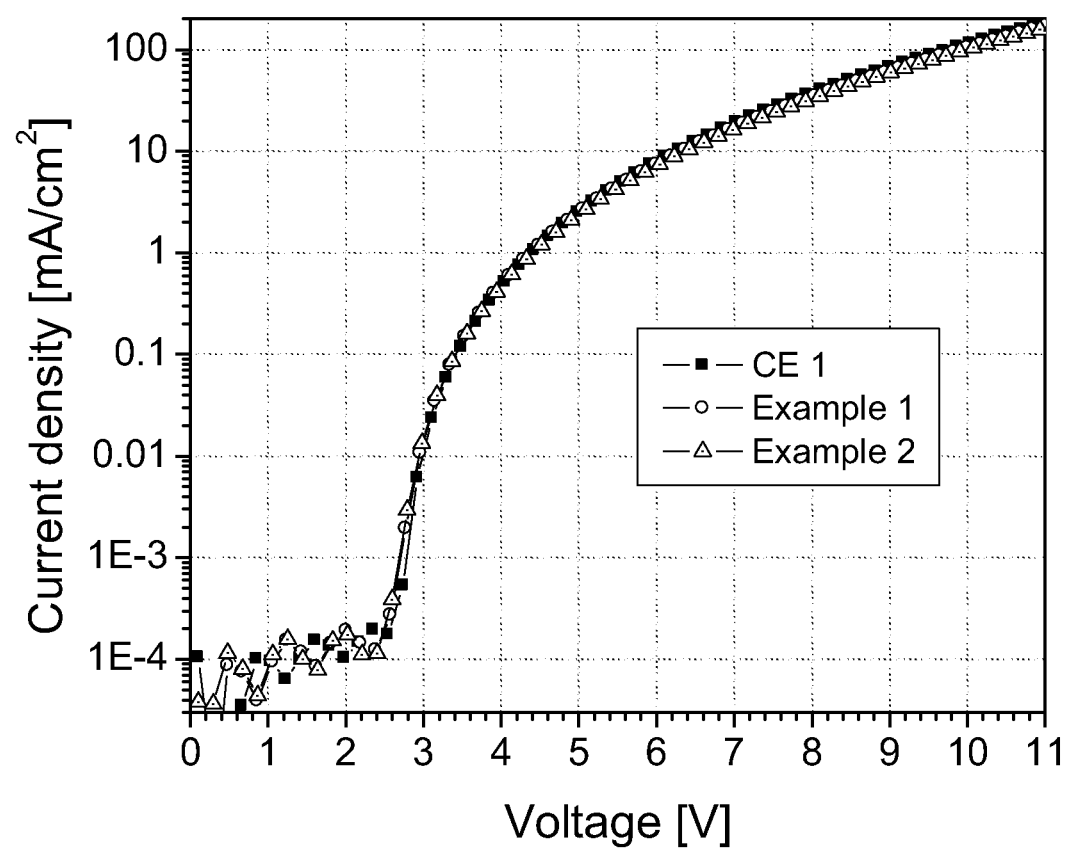
FIG. 5 shows the current density-voltage plot for Examples 1 and 2 and Comparative Example 1.

There appears to be a trend between the level of emission quenching and the thickness of $Alq_3$ quenching layer. It can imply that it is possible to tune the partial quenching level by increasing the thickness of quenching layer or by decreasing the T1 level of the quenching material. With fine tuning using these parameters it may be possible to achieve the desired level of quenching. The current density against the voltage for Example 1, Example 2, and CE1 are shown in FIG. 5.

Compounds referred to in the examples are shown below:

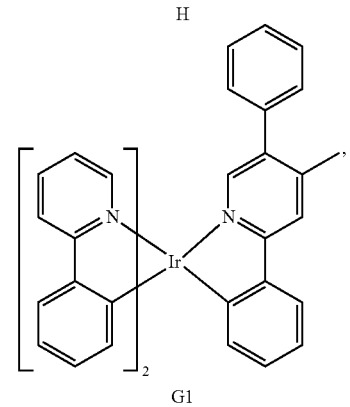

H1

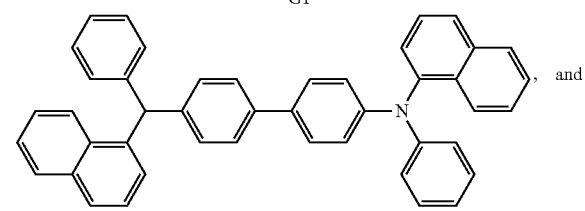

G1

NPD

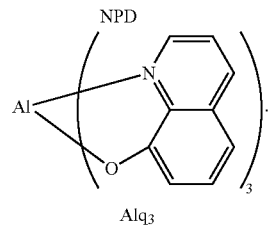

$Alq_3$

Examples 3-5

Figure 6:
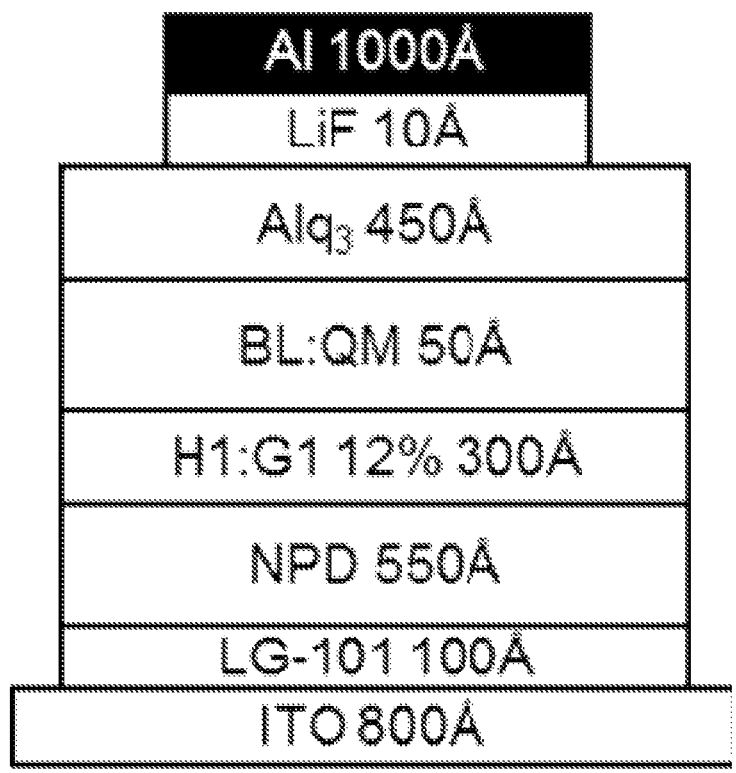
FIG. 6 shows a schematic device structure where the exciton quenching layer is a hole blocking layer doped with a non-emitting quenching material.

FIG. 6 shows the schematic for the device structure used for Examples 3-5, having an 800 Å ITO anode, a 100 Å LG-101 hole injection layer, a 550 Å NPD hole transporting layer, a 300 Å light emitting layer using H1:G1 at 12 percent by weight, a 50 Å H1:Alq3 blocking layer comprising a non-emitting quenching material, a 450 Å $Alq_3$ electron transporting layer, a 10 Å LiF electron injection layer, and a 1000 Å aluminum cathode. $Alq_3$ quencher was used as the non-emitting quenching material. Examples 3, 4, and 5 each employed a different concentration of the non-emitting quenching material, i.e., 5 wt %, 10 wt %, and 20 wt %, respectively in blocking layer.

Figure 7:
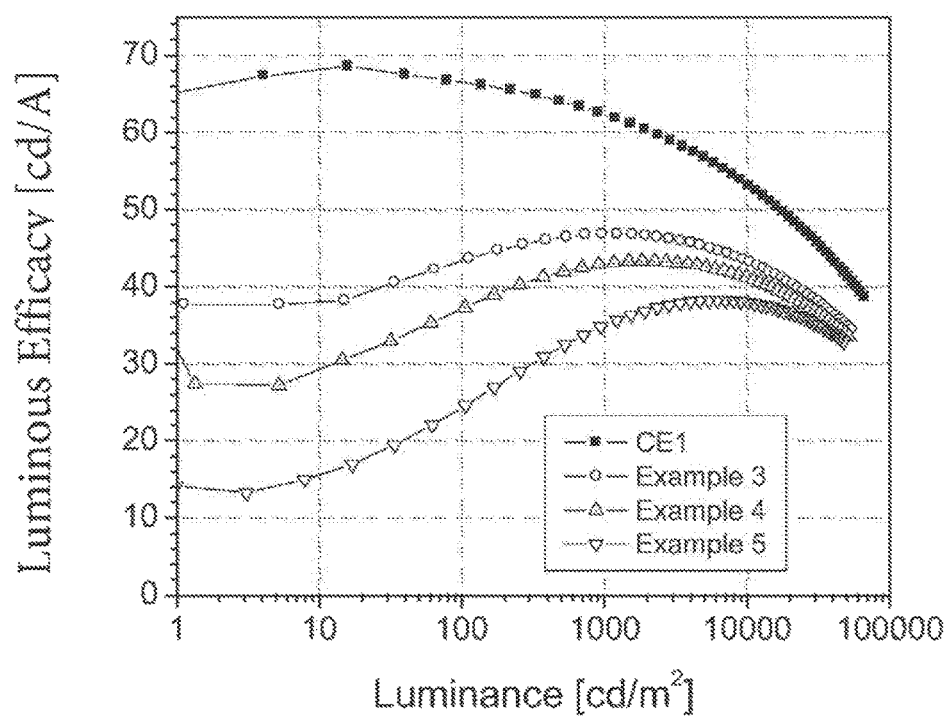
FIG. 7 shows the efficacy-luminance plot for Examples 3-5 and Comparative Example 1.
Figure 8:
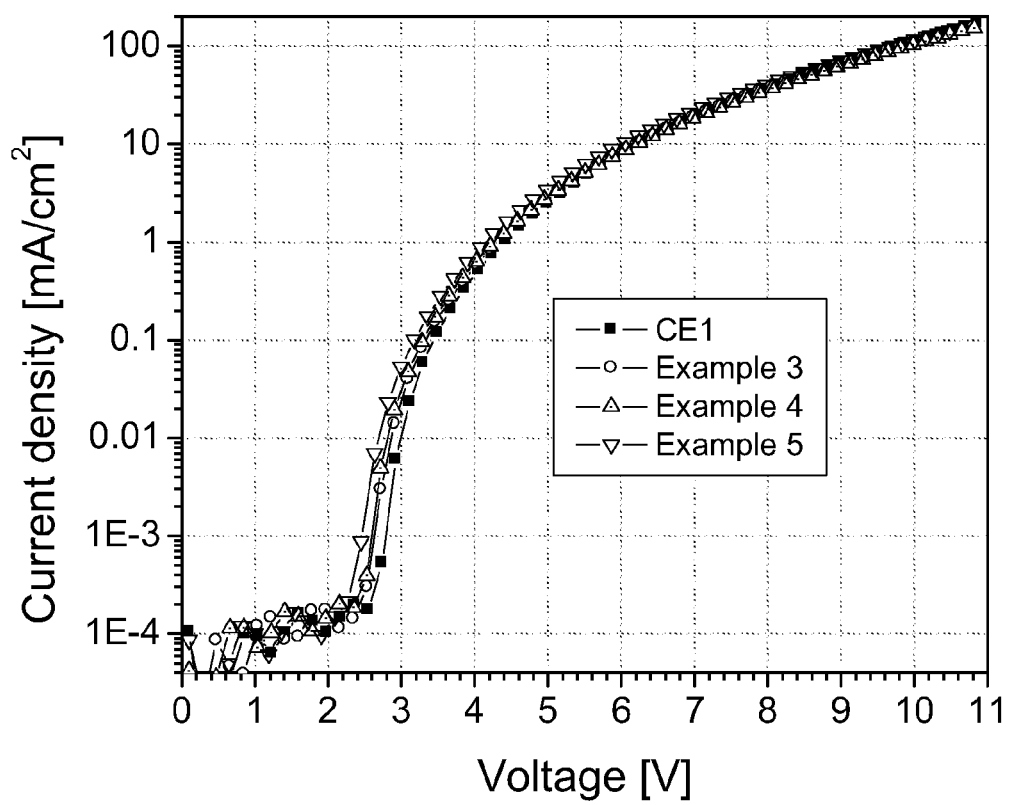
FIG. 8 shows the current density-voltage plot for Examples 3-5 and Comparative Example 1.

The efficiency vs. luminance curve shape as a ratio of luminous efficacy at 3,000 nits to that at 1 nit, the results of which are shown in FIG. 7. The results are shown in the Tables 4 and 5 (below). Increasing the dopant concentration increased the quenching at low luminance. The ratio of LE at 3000 nits to that at 1 nit changed from 0.9 (undoped) to 1.2, 1.6, and 2.7, depending on the dopant concentration.

TABLE 1

| Compound | Function | T1 [eV] |
|---|---|---|
| H | Host | 2.63 |
| G1 | Emitter | 2.40 |
| BL | Hole blocker | 2.63 |
| Alq | ETL, Quencher | 2.0 |
| NPD | HTL, Quencher | 2.29 |

TABLE 2

| Device Example | Quenching layer: $Alq_3$ thickness [Å] | 1931 CIE x | 1931 CIE y | λ max [nm] | FWHM [nm] |
|---|---|---|---|---|---|
| CE 1 | 0 | 0.331 | 0.624 | 526 | 68 |
| Example 1 | 5 | 0.329 | 0.625 | 526 | 66 |
| Example 2 | 10 | 0.328 | 0.624 | 526 | 66 |

TABLE 3

| Device Example | At 1 nit LE [cd/A] | At 3000 nits Voltage [V] | At 3000 nits LE [cd/A] | At 3000 nits EQE [%] | At 3000 nits PE [lm/W] | LE ratio LE at 3,000 nits/LE at 1 nit |
|---|---|---|---|---|---|---|
| CE 1 | 65 | 5.6 | 58.8 | 16 | 33.1 | 0.9 |
| Example 1 | 12 | 6.3 | 29.5 | 8.1 | 14.6 | 2.5 |
| Example 2 | 6 | 6.6 | 24 | 6.6 | 11.3 | 4.0 |

TABLE 4

| Device Example | $Alq_3$ quencher concentration in HBL [%] | 1931 CIE x | 1931 CIE y | λ max [nm] | FWHM [nm] |
|---|---|---|---|---|---|
| CE 1 | 0 | 0.331 | 0.624 | 526 | 68 |
| Example 3 | 5 | 0.337 | 0.620 | 526 | 70 |
| Example 4 | 10 | 0.339 | 0.619 | 526 | 70 |
| Example 5 | 20 | 0.337 | 0.620 | 526 | 70 |

TABLE 5

| Device Example | At 1 nit LE [cd/A] | At 3000 nits Voltage [V] | At 3000 nits LE [cd/A] | At 3000 nits EQE [%] | At 3000 nits PE [lm/W] | LE ratio LE at 3,000 nits/LE at 1 nit |
|---|---|---|---|---|---|---|
| CE 1 | 65 | 5.6 | 58.8 | 16 | 33.1 | 0.9 |
| Example 3 | 38 | 5.7 | 46.1 | 12.6 | 25.2 | 1.2 |
| Example 4 | 27 | 5.8 | 43.1 | 11.8 | 23.4 | 1.6 |
| Example 5 | 14 | 5.8 | 37.7 | 10.3 | 20.6 | 2.7 |

Example 6

Water can also be introduced at the interface of the light emitting layer and the hole blocking layer, and can serve as an exciton quenching material. Vacuum thermally evaporated (VTE) OLEDs are fabricated in high vacuum, e.g. a $10^{-6}$ Pa base pressure and $10^{-8}$ Pa partial pressure of water. If a low vacuum chamber (higher base pressure), i.e. $3\times10^{-2}$ Pa base pressure and $1.5\times10^{-3}$ Pa partial pressure of water, is used and the partially fabricated device is loaded into the low vacuum chamber during fabrication between the emissive layer and blocking or electron transfer layer, a water layer can be introduced. For example, under the low pressure for 2 min tact time the water amount is assumed $\sim1\times10^{13}$ (molecules/cm² of device area) compared to $\sim1\times10^{-8}$ (molecules/cm² of device area) fabricated under high vacuum conditions. Without being bound to any theory, the presence of the water molecules at the interface can decrease the LE of the resulting device at low luminance.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

The invention claimed is:
1. A light emitting device, comprising:
a first electrode;
a second electrode;
a light emitting layer disposed between the first electrode and the second electrode, wherein the light emitting layer comprises an emitting material; and
an exciton quenching layer disposed between the light emitting layer and the second electrode, wherein the exciton quenching layer comprises water molecules;
wherein the exciton quenching layer is disposed adjacent to the light emitting layer; and
wherein the emitting material emits by phosphorescence or delayed fluorescence.

2. The light emitting device of claim 1, wherein the exciton quenching layer comprises water molecules in a concentration ranging from $1\times10^{12}$ to $1\times10^{14}$ molecules/cm² of device area.

3. The light emitting device of claim 1, wherein the light emitting layer comprises an emitting material having a first triplet energy level (T1), the exciton quenching layer comprises a non-emitting quenching material having a second triplet energy level (T1), and the first triplet energy level is higher than the second triplet energy level.

4. The light emitting device of claim 3, wherein the non-emitting quenching material is the water molecules.

5. The light emitting device of claim 1, wherein the exciton quenching layer consists essentially of the non-emitting quenching material.

6. The light emitting device of claim 1, wherein the light emitting layer comprises a first host doped with the emitting material.

7. The light emitting device of claim 6, wherein the exciton quenching layer comprises a second host doped with the non-emitting quenching material.

8. The light emitting device of claim 7, wherein the first host and the second host are the same material.

9. The light emitting device of claim 8, wherein the exciton quenching layer further comprises the emitting material.

10. The light emitting device of claim 1, wherein one of the first electrode and the second electrode is a cathode, further comprising an electron transport layer disposed between the exciton quenching layer and the cathode.

11. The light emitting device of claim 10, wherein the exciton quenching layer is disposed adjacent to the electron transport layer.

12. The light emitting device of claim 10, further comprising a hole blocking layer disposed between the exciton quenching layer and the electron transport layer.

13. The light emitting device of claim 12, wherein the hole blocking layer is disposed directly adjacent to the exciton quenching layer.

14. The light emitting device of claim 1, wherein the exciton quenching layer has a thickness of 0.5 to 50 Å.

15. The light emitting device of claim 1, wherein a ratio of the luminous efficacy of the device when operated at 3000 nits to the luminous efficacy of the device when operated at 1 nit ranges from 1.0 to 10.0.

16. A method of making a light emitting device, comprising:
    depositing a first electrode;
    depositing a second electrode;
    depositing a light emitting layer disposed between the first electrode and the second electrode, wherein the light emitting layer comprises an emitting material having a first triplet energy level (T1); and
    depositing an exciton quenching layer disposed between the light emitting layer and the second electrode, wherein the exciton quenching layer comprises a non-emitting quenching material having a second triplet energy level (T1);
    wherein the exciton quenching layer is disposed adjacent to the light emitting layer;
    wherein the emitting material emits by phosphorescence or delayed fluorescence; and
    wherein the first triplet energy level (T1) is higher than the second triplet energy level (T1).

17. A method of making a light emitting device, comprising:
    depositing a first electrode;
    depositing a second electrode;
    depositing a light emitting layer disposed between the first electrode and the second electrode, wherein the light emitting layer comprises an emitting material; and
    depositing an exciton quenching layer disposed between the light emitting layer and the second electrode, wherein the exciton quenching layer comprises water molecules;
    wherein the exciton quenching layer is disposed adjacent to the light emitting layer; and
    wherein the emitting material emits by phosphorescence or delayed fluorescence.

* * * * *